United States Patent
Slepoy et al.

(10) Patent No.: US 9,866,075 B2
(45) Date of Patent: Jan. 9, 2018

(54) SYSTEM FOR OPTICAL WIRELESS POWER SUPPLY

(71) Applicant: Wi-Charge Ltd., Rehovot (IL)

(72) Inventors: Alexander Slepoy, Chandler, AZ (US); Lior Golan, Ramat Gan (IL); Omer Nahmias, Aminadav (IL); Ran Sagi, Tel Aviv (IL); Ortal Alpert, Ness Ziona (IL); Ori Refael Mor, Tel Aviv (IL)

(73) Assignee: WI-CHARGE LTD., Rehovot (IL)

( * ) Notice: Subject to any disclaimer, the term of this patent is extended or adjusted under 35 U.S.C. 154(b) by 0 days.

(21) Appl. No.: 15/484,722

(22) Filed: Apr. 11, 2017

(65) Prior Publication Data

US 2017/0294809 A1    Oct. 12, 2017

Related U.S. Application Data

(60) Provisional application No. 62/320,679, filed on Apr. 11, 2016.

(51) Int. Cl.
*H02J 50/30* (2016.01)
*H04B 10/80* (2013.01)
(Continued)

(52) U.S. Cl.
CPC .......... *H02J 50/30* (2016.02); *H01L 31/0304* (2013.01); *H02J 7/025* (2013.01); *H02J 7/355* (2013.01); *H02J 50/40* (2016.02)

(58) Field of Classification Search
CPC combination set(s) only.
See application file for complete search history.

(56) References Cited

U.S. PATENT DOCUMENTS

| 1,119,732 A | 12/1914 | Tesla |
| 3,174,705 A | 2/1965 | Schiff et al. |

(Continued)

FOREIGN PATENT DOCUMENTS

| WO | 1998013909 A2 | 4/1998 |
| WO | 2011112795 A1 | 9/2011 |

OTHER PUBLICATIONS

Barbara Stuart, first part of chapter 6 of "Infrared Spectroscopy: Fundamentals and Applications", 2004, John Wiley & Sons, Ltd.

*Primary Examiner* — Rexford Barnie
*Assistant Examiner* — Elim Ortiz
(74) *Attorney, Agent, or Firm* — Maine Cernota & Rardin

(57) ABSTRACT

A system incorporating safety features, for optical power transmission to receivers, comprising an optical resonator having end reflectors and a gain medium, a driver supplying power to the gain medium, and controlling its small signal gain, a beam steering apparatus and a controller to control at least the beam steering apparatus and the driver. The controller responds to a safety risk occurring in the system, by outputting a command to change at least some of the small signal gain of the gain medium, the radiance of the optical beam, the power supplied by the driver, the scan speed or the scan direction and position of the beam steering apparatus, or to register the scan pose which defines the location of said optical-to-electrical power converter. The controller may also ensure a high overall radiance efficiency, and may warn of transmitted power not received by a targeted receiver.

26 Claims, 15 Drawing Sheets

(51) Int. Cl.
    *H02J 50/40*     (2016.01)
    *H02J 7/02*     (2016.01)
    *H01L 31/0304*     (2006.01)
    *H02J 7/35*     (2006.01)

(56) References Cited

U.S. PATENT DOCUMENTS

| | | |
|---|---|---|
| 3,370,986 A | 2/1968 | Amsterdam et al. |
| 3,781,647 A | 12/1973 | Glaser |
| 3,989,994 A | 11/1976 | Brown |
| 4,493,085 A | 1/1985 | Valley |
| 4,955,562 A | 9/1990 | Martin et al. |
| 5,260,639 A | 11/1993 | De Young et al. |
| 6,407,535 B1 | 6/2002 | Freidman et al. |
| 6,534,705 B2 | 3/2003 | Berrios et al. |
| 6,633,026 B2 | 10/2003 | Tuominen |
| 6,687,036 B2 * | 2/2004 | Riza .................... G02B 26/106 |
| | | 250/550 |
| 7,741,734 B2 | 6/2010 | Joannopoulas et al. |
| 8,168,930 B2 | 5/2012 | Hyde et al. |
| 8,400,018 B2 | 3/2013 | Joannopoulos et al. |
| 8,400,022 B2 | 3/2013 | Joannopoulos et al. |
| 8,472,764 B2 | 6/2013 | Chan et al. |
| 8,629,578 B2 | 1/2014 | Kurs et al. |
| 8,835,823 B2 | 9/2014 | Hyde et al. |
| 2007/0019693 A1 | 1/2007 | Graham |
| 2009/0103925 A1 | 4/2009 | Alpert et al. |
| 2010/0320362 A1 * | 12/2010 | Alpert .................... H01S 3/083 |
| | | 250/200 |
| 2013/0264870 A1 * | 10/2013 | Keysar .................... H02J 1/00 |
| | | 307/24 |
| 2014/0092929 A1 | 4/2014 | Alpert et al. |
| 2014/0126603 A1 | 5/2014 | Della-Pergola |

\* cited by examiner

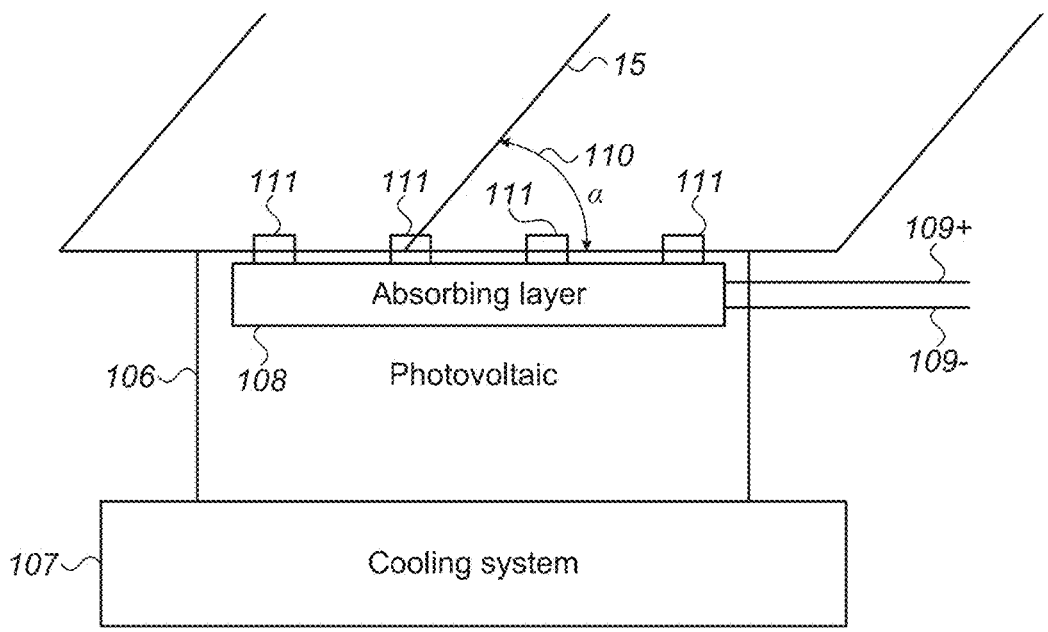
*FIG. 20*
*FIG. 21*
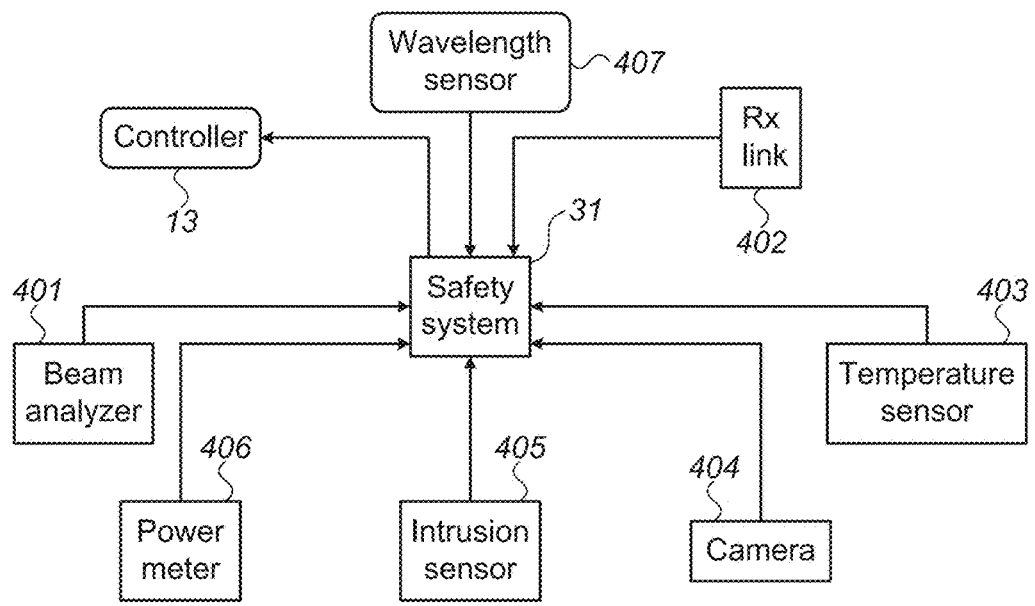

SYSTEM FOR OPTICAL WIRELESS POWER SUPPLY

RELATED APPLICATIONS

This application claims the benefit of U.S. Provisional Application No. 62/320,679, filed Apr. 11, 2016. This application is herein incorporated by reference in its entirety for all purposes.

FIELD OF THE INVENTION

The present invention relates to the field of wireless power beaming, especially as applied to use of a laser based transmission system to beam optical power in a domestic environment to a mobile electronic device.

BACKGROUND OF THE INVENTION

There exists a long felt need for the transmission of power to a remote location without the need for a physical wire connection. This need has become important in the last few decades, with the popularization of portable electronic devices operated by batteries, which need recharging periodically. Such mobile applications include mobile phones, laptops, cars, toys, wearable devices and hearing aids. Presently, the capacity of state of the art batteries and the typical battery use of a smart phone intensively used may be such that the battery may need charging more than once a day, such that the need for remote wireless battery recharging is important.

Battery technology has a long history, and is still developing. In 1748 Benjamin Franklin described the first battery made of Leyden jars, the first electrical power source, which resembled a cannon battery (hence the name battery). Later in 1800, Volta invented the copper zinc battery, which was significantly more portable. The first rechargeable battery, the lead acid battery, was invented in 1859 by Gaston Plante. Since then the energy density of rechargeable batteries has increased less than 8 times, as observed in FIG. 1, which shows the energy density, both in weight and volume parameters, of various rechargeable battery chemistries, from the original lead acid chemistry to the present day lithium based chemistries and the zinc-air chemistry. At the same time the power consumed by portable electronic/electrical devices has reached a point where several full battery charges may need to be replenished each day.

Almost a century after the invention of the battery, in the period between 1870 and 1910, Tesla attempted the transmission of power over distance using electromagnetic waves. Since then, many attempts have been made to transmit power safely to remote locations, which can be characterized as over a distance significantly larger than the transmitting or receiving device. This ranges from NASA, who conducted the SHARP (Stationary High Altitude Relay Platform) project in the 1980s to Marin Soljacic, who experimented with Tesla-like systems in 2007.

Yet, to date, only three commercially available technologies allow transfer of power to mobile devices safely without wires namely:

Magnetic induction—which is typically limited in range to just a few mm;

Photovoltaic cells—which cannot produce more than 0.1 Watt for the size relevant to mobile phones when illuminated by either solar light or by available levels of artificial lighting in a normally (safe) lit room; and Energy harvesting techniques—which convert RF waves into usable energy, but cannot operate with more than 0.01 W in any currently practical situation, since RF signal transmission is limited due to health and FCC regulations.

At the same time, the typical battery of a portable electronic device has a capacity of between 1 and 100 Watt*hour, and typically requires a daily charge, hence a much higher power transfer at a much longer range is needed.

There is therefore an unmet need to safely transfer electrical power, over a large field of view and a range larger than a few meters, to portable electronic devices, which are typically equipped with a rechargeable battery.

A few attempts to transfer power in residential environments, using collimated or essentially collimated, electromagnetic waves, especially laser beams, have been attempted. However, commercial availability of such products to the mass market is limited at the current time. A few problems need to be solved before such a commercial system can be launched:

A system should be developed which is safe.

A system should be developed which is cost effective.

A system should be developed which is capable of enduring the hazards of a common household environment, including contamination such as dust and fingerprints or liquid spills, vibrations, blocking of the beam, unprofessional installation, and periodic dropping onto the floor.

Currently allowed public exposure to transmitted laser power levels are insufficient for providing useful amount of power without a complex safety system. For example, in the US, the Code of Federal Regulations, title 21, volume 8, (21 CFR §8), revised on April 2014, Chapter I, Subchapter J part 1040 deals with performance standards for light emitting products, including laser products. For wavelengths outside of the visible range, there exist, class I, class III-b and class IV lasers (class II, IIa, and IIIa are for lasers between 400 nm and 710 nm, e.g. visible lasers). Of the lasers outside the visible range, class 1 is considered safe for general public use and classes IIIb and IV are considered unsafe.

Reference is now made to FIG. 2 which is a graph showing the MPE (maximal permissible exposure value) for a 7 mm. pupil diameter, for class I lasers, according to the above referenced 21 CFR §8, for 0.1-60 seconds exposure. It can be seen from the above graph that:

(i) The maximum permissible exposure levels generally (but not always) increase with wavelength, and (ii) Even if the laser is turned off some 0.1 second after a person enters the beam, in order to meet the requirement specified in 21 CFR §8, no more than 1.25 W of light can be transmitted, and that at wavelengths longer than 2.5µ, with the limit orders of magnitude less at shorter wavelengths.

Thus, without some kind of safety system, only a few milliwatts of laser power are allowed to be transmitted, which even if completely converted back to electricity, would supply significantly less power than the power needed to charge most portable electronic devices. A cellular phone, for example, requires from 1 to 12 W for charging, depending on the model.

To transmit power higher than that of class 1 laser MPE, a safety system is needed. None, to the best of the applicants' knowledge, has yet been commercialized for transmitting significant power levels in residential environment accessible to untrained people.

Building of a transmission system having a robust safety system is difficult. The required detection levels are very small compared to the power that needs to be transmitted, the environment in which the system operates is uncontrolled and many unpredictable scenarios may happen while working.

It is well known in the art that fingerprints and dust scatter laser light and that transparent surfaces reflect or scatter it. If high power is to be transferred, then a class IV (or IIIb) laser would be needed, which would require a reliable safety system. For Class IV lasers, even scattered radiation from the main beam is dangerous. According to the 21 CFR §8, as revised on April 2014, Chapter I, Subchapter J part 1040, lasers emitting between 400 nm and 1400 nm, having more than 0.5 W beam output, are usually considered class IV lasers for exposures above 0.5 sec, and even scattered radiation from such lasers may be dangerous. Such lasers are required to have a lock key and a warning label similar to that shown in FIG. 3, where it is noted that the warning relates to "scattered radiation" also, and the user of the laser is usually required to wear safety googles and is typically a trained professional, all of these aspects being very different from the acceptable conditions of use of a domestically available laser power transmission system for charging mobile electronic devices.

The prior art typically uses anti-reflective coatings on surfaces to prevent such reflections, in combination with elaborate beam blocking structures to block such reflections, should they nevertheless occur. However, the AR-coating solution used in the prior art is prone to failure from dust or spilled liquid deposited on its surface, or from coating wear and tear, such as from improper cleaning. Additionally, the beam block solution typically limits the field of view of the system severely, and is bulky compared to the dimensions of modern portable electronic devices.

The prior art therefore lacks a reliable and "small footprint" mechanism to prevent scattering and reflections from the power beam in unwanted directions. Such scattering and reflections may be caused either by a transparent surface inadvertently placed between the transmitter and the receiver, and the optical characteristics of that transparent surface may arise from a vast number of different transparent materials, or from liquid spills and fingerprints which may be deposited on the external surfaces of the system, typically on the front surface of the receiver.

A third problem with the solutions suggested in the prior art, is that such safety systems generally require a mechanism to guarantee good alignment of the power beam system and the safety system such that both systems are boresighted on the same axis until the power beam diverges enough or is attenuated enough (or a combination of these factors and any other factors) so that it no longer exceeds safety limits. This is extremely difficult to achieve with a collimated class IV or IIIb laser beam, which typically expands very little with distance and thus exceeds the safety limit for a very long distance.

One prior art principle of operation used to build such a safety system is the optical detection of transparent surfaces that may be positioned in the beam's path. However transparent surfaces that may enter the beam path may be made from a vast number of different transparent materials, may be antireflection AR coated or may be placed in an angle close to Brewster's angle so they are almost invisible to an optical system unless they absorb the beam. However, since light absorption levels for each material are different, and may even be negligible, and since building an optical system that relies on optical absorption will be highly material specific, and since the number of available materials is extremely large, such a system is likely to be complex, large and expensive, and unless properly designed, is likely to be unreliable, especially when considering that it is meant to be a critical safety system. Relying on the reflections to provide detectable attenuation of the beam is also problematic, as the surfaces may be coated by an anti-reflective coating or positioned in a near Brewster angle to the beam, such that the reflection may be minimal for that particular position of the surface.

Another limitation of prior art systems is that they are typically use lasers having good beam quality (low $m^2$ value) combined with large optics in order to yield high efficiency (for example U.S. Pat. No. 6,407,535 B1 and U.S. Pat. No. 6,534,705 B2 uses a wide aperture for the laser beams) while U.S. Pat. No. 5,260,639 uses a wavelength of 0.8 um to allow for small optics, reducing cost and size of the optical system.

There therefore exists a need for a laser power transmission system with built-in safety features, which overcomes at least some of the disadvantages of prior art systems and methods.

The disclosures of each of the publications mentioned in this section and in other sections of the specification, are hereby incorporated by reference, each in its entirety.

SUMMARY OF THE INVENTION

One of the main challenges of wireless power transmission is building a safe, low cost, and small transmitter and receiver, which is nevertheless powerful (e.g. capable of transmitting significant levels of power). In order to enable powerful and small transmitter and receivers it is essential to keep the radiance of the beam as high as possible throughout the optical path, but especially at the output of the transmitter. Every component in the optical path causes a certain loss of radiance. In this document, the term radiance efficiency is sometimes used—its usual meaning in the context of this document is the ratio of the outgoing radiance of an optical component to the incoming radiance of the beam entering the component. For components that may be configured in various ways, such as a mirror that may be tilted on different angles. There may be a different radiant efficiency for each configuration.

In general the system as a whole needs to have a radiant efficiency as high as possible, typical values of more than 60% radiant efficiency and even up to 90% or 95% should be strived for.

The transmitter's radiant efficiency is generally far more important than the receiver's radiant efficiency. There are two main factors reducing the beams radiance—the laser system and the radiant efficiency of the transmitter. Besides these factors, other more minor factors also influence it.

Lasers with high radiance values are generally bigger and more complex, while lasers having lower radiance are typically smaller and simpler. The present system is limited in laser radiance because it typically uses an uncommon wavelength allowing for improved safety features, and small, low cost, high radiance lasers at such unconventional wavelengths are less commonly available and are likely to increase the cost of the system.

Prior art systems such as U.S. Pat. Nos. 5,260,639 and 6,407,535 B1 use a shorter wavelength (0.8 μm or 0.534 μm) to allow for a more compact transmitter and receiver, however the current system utilizes a longer wavelength and hence is required to use different methods to reduce the size of the system.

The longer wavelength used by the current system allows for detection of transparent plastics in the beam's path by using a wavelength that is specifically absorbed by virtually all plastic materials, as explained in U.S. patent application Ser. No. 14/811,260, having common inventors with the present application.

Opaque or even partially opaque materials can be easily detected when placed in the beam, by measuring the beam's attenuation. However some materials are transparent or nearly transparent and it is such transparent materials that are significantly harder to detect. There are two major groups of solid transparent materials, organic and inorganic materials. The number of inorganic transparent solid materials available to the general public is fairly limited, consisting mostly of glasses, a few semiconductor materials in common use, quartz, and some naturally occurring minerals such as diamonds, ruby and calcite. It is therefore possible to build a detection system for reflections from inorganic transparent materials, covering all likely scenarios.

On the other hand, the availability of different organic, transparent materials to the general public is enormous, and new transparent materials are being added to the list all the time. This is a significant problem as characterizing this group optically is thus virtually impossible.

Polymers are a significant group of transparent organic materials, and they will be used as a sample group to assist in explaining the way in which the current invention is intended to operate. Polymers typically consist of long chains of monomers, with the backbone of such polymers being typically made of either carbon or silicon. FIGS. 4 to 9 show the chemical structure of some commonly used transparent polymers. FIG. 4 shows a Poly-methyl methacrylate (PMMA) chain; FIG. 5 shows the structure of a polycarbonate; FIG. 6 shows the polystyrene structure; FIG. 7 shows nylon 6,6; FIG. 8 shows a polypropylene chain; and FIG. 9 shows the polyethylene chain structure.

As is observed, the chemical structure of the sample polymers shown is very different, and the absorption spectra of these polymers depend on many factors including the density of the material, trace amounts of reagent, and the chain length. Yet it is observed that all the above transparent polymers have some chemical bonds in common, especially C—C and C—H bonds. This is especially true for commercially available polymers, which are almost entirely based on organic materials, which would be detected by the systems of the present disclosure, or semi-organic silicon based polymers such as silicones, polysilanes, polygermanes and polystannanes, or polyphospahazenes, which would also be detected by systems of the present disclosure.

Apart from that, the number of transparent materials available to the general public which is not based on carbon chemistry is fairly limited, consisting mostly of various glasses, most of which have readily available data on their transmission spectra.

If a system were designed so that the laser excites either a vibrational C—H, or also possibly a C—C bond in polymers, then it would be easy to detect when one such polymer were positioned within the beam, by monitoring the power drop caused by the polymer. This assumes that the absorption of the C—H or C—C bond is always present and is always wavelength aligned to the laser wavelength. Rotational peaks could also be used for this purpose, but they may be unreliable in polymers, such that the vibrational C—H (or C—C) absorptions are better suited for this purpose.

Reference is now made to FIG. 10, which shows a chart of typical absorption regions of different polymer bonds. It is observed that the C—H stretch vibration around 2900-3200 $cm^{-1}$, appears in almost all of the polymers shown. This could therefore be used as the absorption mechanism trigger for a safety system, using the change in transmitted power resulting from the absorption bands. However, there are two problems with these absorption bands, which make them less useful for this purpose.

(i) The C—H vibrational absorption lines are typically very sharp, and their exact frequency varies much from one polymer to another, so a laser may excite one polymer, but not another. Thus, unless the laser is tuned exactly to the specific C—H vibration line of that polymer, it would not be absorbed.

(ii) Such C—H vibration peaks are generally medium absorption peaks, meaning that the attenuation of a beam due to a material section a few mm thick would be 20-50% (i.e. it allows detection of even trace amounts of material in a small container), and while medium (20-70% attenuation per cm material) and strong (>70% attenuation per cm) absorption peaks are generally much easier to detect, they cannot be used to construct a robust system.

In a commercial system, designed for the consumer environment, fingerprints are a common problem. In normal operation the system should not fail simply when a fingerprint is deposited upon it; instead the system should shut down transmission when there is a risk of exceeding safety limits. To do this, the system should detect blocking of the beam but should not cease transmission due to any fingerprint deposited on the receiver. If a strong or medium absorption peak is used, then should a fingerprint or some other contamination be deposited on the external optical surface of the receiver or transmitter, it would absorb the beam significantly, causing power transmission to fail. This arises since fingerprints also contain organic compounds that would absorb the beam, resulting in uncontrolled system failure. In order to allow the system to operate in an environment where organic materials such as fingerprints may be deposited on the surface of its typically external optical components, it would be necessary to build a system where the laser beam successfully traverses the finger print, while the safety system detects dangerous transparent items that may be inserted into the beam. If, on the other hand, a safety system were to utilize a weak absorption band instead of a medium or strong one, then the system should continue to operate with the fingerprint, and shutoff may be done based on an electronic decision and not in an uncontrolled manner.

Turning to the C—C absorption band, stretching from 800 $cm^{-1}$ to 1300 $cm^-$, this is such a wide band that a narrowband laser is almost certain to miss a narrowband absorption peak in this region—since while the peak may be positioned in the 800 $cm^{-1}$ to 1300 $cm^{-1}$ range, its typical width is very small, and may be easily missed by a narrowband laser. Additionally, as will be seen in FIG. 11 hereinbelow, this band vanishes for some polymers, where no absorption peak is visible between 800 and 1300 $cm^-$ and some polymers may exist where C—C bonds are not present, and are replaced by aromatic carbon-carbon bonds or by C=C bonds and C—O—C bonds.

An additional problem arises from the absorption strength of the C—C line. In symmetrical compounds such as polyethylene, it may be nearly impossible to detect, while in other compounds it may be so strong that even a weak fingerprint on the surface of the receiver will make the system inoperable, as a significant portion of the power may be absorbed by the fingerprint, making the device unusable.

To enable operation of a system in which fingerprints may be deposited on its optical surfaces, a weak, but not too weak absorption line is required that will not change much between different polymers and which would be found in most organic polymers, and a laser tuned to that peak should be used, in conjunction with a system that operates around that peak. As can be seen from FIG. 10, there is no such peak in the commonly used polymers and in the absorption bands shown.

A system for optical wireless power transmission to a power receiving apparatus may comprise:

(a) an optical resonator having end reflectors and adapted to emit an optical beam, (b) a gain medium positioned inside the optical resonator and having a first bandgap energy, the gain medium being thermally attached to a cooling system and configured to amplify light passing through it, (c) a collimating lens, reducing the divergence of the light, and having a high radiant efficiency (>50%)

(d) a driver supplying power to the gain medium, and controlling the small signal gain of the gain medium, (e) a beam steering apparatus configured to direct the optical beam in at least one of a plurality of directions, and typically having a high radiant efficiency, typically larger than 50%), (f) an optical-to-electrical power converter configured to convert the optical beam into electrical power having a voltage, the optical-to-electrical power converter having a second bandgap energy, and a thickness such that it acts as an absorbing layer (typically a semiconductor).

(g) an electrical voltage converter, adapted to convert the voltage of the electrical power generated by the optical-to-electrical power converter into a different voltage, the electrical voltage converter comprising an inductor, an energy storage device and a switch, (h) at least one surface associated with the optical-to-electrical power converter and optically disposed between the gain medium and the optical-to-electrical power converter, (i) a detector configured to provide a signal indicative of the optical beam impinging on the optical-to-electrical power converter, (j) a safety system assessing the potential for a breach of security, (k) a controller adapted to control at least one of the status of the beam steering apparatus and the driver, the controller receiving a control input signal from at least the detector, wherein:

(l) the at least one surface has properties such that it reflects a small part of light incident on it, either (i) in more than one direction, or (ii) such that the reflected light has a virtual focus positioned remotely from the optical resonator relative to the surface, or (iii) such that the reflected light has a real focus positioned at least 1 cm. in the direction of the optical resonator relative to the surface, (m) the controller is configured to respond to the control input signal received from the detector by at least one of (i) causing the driver to change the small signal gain of the gain medium, (ii) changing the radiance of the optical beam, (iii) changing the power supplied by the driver, (iv) changing the scan speed of the beam steering apparatus, (v) changing the scan position of the beam steering apparatus, and (vi) recording a scan position defining the position of the optical-to-electrical power converter, (n) the gain medium is a semiconductor device or a solid host doped with Nd ions, and includes a filter attenuating radiation for at least one frequency having a wave number in the range 8,300 $cm^{-1}$ to 12,500 $cm^{-1}$, (o) the thickness of the optical-to-electrical power converter active semiconductor layer is selected to be large enough to absorb most of the optical beam yet not so large that the quantum efficiency of the semiconductor layer becomes significantly reduced.

(p) the second bandgap energy is smaller than the first bandgap energy, (q) the first bandgap energy is between 0.8 eV and 1.1 eV, (r) the switch has a closed serial resistance smaller than R, given by the equation:

$$R \le \frac{E_{gain}^2}{2*10^{-40}*P_{laser\ driver}}$$

where R is measured in Ohms, $E_{gain}$ is the first bandgap energy measured in Joules, and $P_{laser\ driver}$ is the power supplied by the laser driver to the gain medium, measured in Watts, (s) the optical beam has a radiance of at least 8 $kW/m^2$/Steradian, and a frequency between the first overtone of the C—H absorption situated at approximately 6940 $cm^{-1}$ and the second overtone of the C—H absorption situated at approximately 8130 $cm^{-1}$, and (t) the optical components in the system, especially the collimation lens and the beam director, have a radiant efficiency of at least 50%.

In any such a system, the different voltage may be a higher voltage than the voltage generated by the optical-to-electrical converter. Furthermore, the status of the beam steering apparatus may be either or both of the aiming direction and the scan speed of the beam steering apparatus.

Furthermore, in any of the above-described systems the optical beam may have a radiance of at least 800 $kW/m^2$/Steradian.

Another example implementation can involve any of the above described systems in which each one of the end reflectors of the resonator are either (i) dielectric mirrors, (ii) Bragg mirrors, (iii) Fresnel reflectors or (iv) mirrors composed of alternating layers of dielectric or semiconductor material having different refractive indexes. Additionally, the gain medium can be either a transparent solid host material doped with Nd ions or a semiconductor. In such a case, the system may further comprise a filter for extracting radiation having a wave-number greater than 8300 $cm^{-1}$. In the event that the gain medium is a semiconductor, it may advantageously be a quantum dot gain medium.

In further exemplary implementations of the above described systems, the cooling system may be at least one of a heatsink, a Peltier diode, and a liquid cooled plate. It may also be equipped with a fan. Additionally, the gain medium may be attached to the cooling system using a layer of solder having less than 200° Kelvin/Watt thermal resistance. In any event, the cooling system may be such that the thermal resistance between the gain medium and the surrounding air is less than 200° Kelvin/Watt.

In alternative implementations of any of the above-described systems, the optical-to-electrical power converter may be a photovoltaic cell. In such a case, the photovoltaic cell may be a III-V device. In any event, the serial resistance of the optical-to-electrical power converter should be less than 1 Ohm.

The optical to electrical power converter typically has conductors on it, which have a thickness of at least $0.02/_{\mu 10}$ where $_{\mu 10}$ is the decadic attenuation coefficient measured in 1/m.

Such conductors should have a thickness that is at least $$\frac{0.01 * P\rho}{V^2 * \chi}$$

meters, where:
P is the transmitted power absorbed by the photovoltaic, measured in watts,
ρ is the specific electrical resistivity of the conductors,
V is the voltage emitted by the photovoltaic cell at its maximal power point, and
χ is the fraction of the area of the absorbing layer covered by conductors According to further implementations of the above described systems, the inductor should have a serial resistance measured in Ohms of less than the square of the first bandgap energy measured in Joules divided by $2*10^{-40}$ times the driver power measured in Watts.

In other implementations, the energy storage device may be either a capacitor or a rechargeable battery.

According to further implementations of the above described systems, at least one safety system is included, which estimates the probability of a breach of safety, given inputs from various sensors and monitors This is different from prior art systems, which provide actual measurement data only, such as the radar system in U.S. Pat. No. 6,407,535, with no indication of the probability of an error. The present system differs in that it provides a signal indicative of the probability of a breach of safety, as opposed to an actually detected breach of safety. This allows several significant advantages. Firstly, the system can react to potentially problematic situations, which become apparent by a low signal-to-noise, or a signal interruption, by differentiating between high risk situations and lower risk situations, and reacting differently to each situation. For instance, a low risk situation such as caused by a dirty aperture, by alignment faults, or similar occurrences, can be dealt with differently from a high risk situation, such as a high probability of beam intrusion, or an unreasonable beam power, whether high or low. Secondly, the system can combine probabilities from different safety systems into a unified probability, in order to achieve a sufficiently high detection accuracy. For example, if a system is designed to have a failure rate of 10-9 failures per hour, typically, in a changing environment, no single safety system can provide such reliable measurements without failure. However, a combination of safety systems can have better failure rate and if such data is combined with the probability of error, and if the statistical correlation of errors from both safety systems is known or can be estimated or approximated, then the data from the two systems may be combined to yield data with significantly higher probability. Such reliability data may be estimated, inter alia, from signal-to-noise, from the temperature of components, from preloaded data based on measurements on the same device or on a similar device, from user entered information, updated by the manufacturer or distributer or supplied by the user.

According to further implementations of the above described system the output beam of said laser resonator is collimated (or brought to near collimation) on at least one axis using a lens. The lens needs to have a high radiance efficiency (typically more than 50%), for which a high Numerical Aperture (NA) lens should be used.

According to a further implementation of the above described systems, the beam deflection mechanism also needs to have a high radiance efficiency of more than 50% and also needs to be positioned so that its center of rotation is close to either the weighted average point of the beam, to the maximal intensity point of the beam or to the center of the 50% intensity line or 90% intensity lines of the beam.

An overall radiance efficiency for the transmission/reception/conversion process of 30% is a desirable level to render the system energy efficient, but it is to be understood that this is limited by the constraints of available components, and their environmental state, and that levels below 30% are also operable, such as 20%, or even less.

Additionally, any of the above described systems may further comprise a retro reflector. Also, the gain medium may be pumped electrically or optically by the driver. Furthermore, the second bandgap energy may be more than 50% of the first bandgap energy.

Yet other implementations perform a method for transmitting power from a transmitter to a receiver, comprising:
(a) converting a first electrical power to an electromagnetic wave having a frequency between the first overtone of the C—H absorption situated at approximately 6940 cm$^{-1}$ and the second overtone of the C—H absorption situated at approximately 8130 cm-1, the electromagnetic wave having a radiance of at least 8 kW/m$^2$/Steradian, the converting being performed by using an optical resonator having end reflectors and a gain medium connected to a laser driver receiving the first electrical power, the gain medium having a first bandgap energy between 0.8 eV and 1.1 eV, being positioned inside the optical resonator, being thermally attached to a cooling system, and configured to amplify the electromagnetic wave passing through it,
(b) directing the electromagnetic wave into at least one of a plurality of directions using a beam steering apparatus controlled by a controlling unit,
(c) detecting the impingement of the beam on a target having an associated partially transparent surface, such that an indication relating to the impingement may be utilized by the controlling unit to perform at least one of (i) causing a change in the small signal gain of the gain medium, (ii) causing a change in the radiance of the electromagnetic beam, (iii) causing a change in the first electrical power, (iv) changing the scan speed of the beam steering apparatus, (v) changing the scan position of the beam steering apparatus, and (vi) recording a scan position defining the position of the target,
(d) converting the electromagnetic wave into a second electrical power having a voltage, by using an optical-to-electrical power converter having a second bandgap energy smaller than the first bandgap energy,
(e) converting the voltage into a different voltage using an electrical voltage converter, comprising an inductor, an energy storage device and a switch having a closed serial resistance smaller than R, given by the equation:

$$R \le \frac{E_{gain}^2}{2*10^{-40} * P_{laser\ driver}}$$

where R is measured in Ohms, $E_{gain}$ is the first bandgap energy measured in Joules, and $P_{laser\_driver}$ is the first electrical power, measured in Watts, wherein (f) the surface is designed such that it reflects a small part of the electromagnetic wave incident on it either (i) diffusively, or (ii) such that the reflected light has a virtual focus positioned remotely from the optical resonator relative to the surface, or (iii) such that the reflected light has a real focus positioned at least 1 cm. in the direction of the optical resonator relative to the surface, and (g) the gain medium is either a semiconductor device, or a solid host doped with Nd ions that includes a filter attenuating radiation for at least one frequency having a wave number in the range 8,300 cm$^{-1}$ to 12,500 cm$^{-1}$, In such a method, the switch may be switched at a frequency determined by the equations:

$$f < \frac{1}{1.28 * 10^{-40} * L} * E_{gain}^2 * \frac{1 - \frac{E_{gain}}{5 * 10^{-19} * V_{output}}}{P_{laser\_driver}}$$

$$f > \frac{1}{3 * 10^{-38} * L} * E_{gain}^2 * \frac{\left(1 - \frac{E_{gain}}{4 * 10^{-20} * V_{output}}\right)}{P_{laser\_driver}}$$

where f is the switching frequency measured in Hz, $E_{gain}$ is the bandgap of the gain medium, measured in Joules, $V_{output}$ is the output voltage from the voltage converter, measured in Volts, and $P_{laser\_driver}$ is the power pumped by the laser driver onto the gain medium, measured in Watts.

Additionally, the detection of impingement of the beam on the target may be done using either detection in the transmitter of retro reflected illumination from the target, or detection of illumination of the target using a receiver sensor.

Furthermore, in any of the above described methods, the second bandgap energy may be more than 50% of the first bandgap energy.

Even other embodiments of the present disclosure provide a system for optical wireless power transmission to at least one power receiving apparatus, the system comprising:

(i) an optical resonator having end reflectors and adapted to emit an optical beam, (ii) a gain medium comprising either (a) a semiconductor device, or (b) a solid host doped with Neodymium ions and in optical communication with a filter attenuating radiation for at least one frequency having a wave number in the range 8,300 cm$^{-1}$ to 12,500 cm$^{-1}$, the gain medium being positioned inside the optical resonator and having a first bandgap energy, the gain medium being thermally attached to a cooling system and configured to amplify light passing through it, (iii) a driver configured to supply power to the gain medium, and enabling control of the small signal gain of the gain medium, (iv) a beam steering apparatus configured to direct the optical beam in at least one of a plurality of directions, (v) an optical-to-electrical power converter located in the at least one power receiving apparatus and configured to convert the optical beam into electrical power having a voltage, the optical-to-electrical power converter having a second bandgap energy, (vi) a detector configured to provide a signal indicative of the optical beam impinging on the optical-to-electrical power converter, and (vii) a controller adapted to control at least one of the status of the beam steering apparatus and the driver, the controller receiving a control input signal at least from the detector, wherein the optical beam has a radiance of at least 8 kW/m$^2$/Steradian and the overall radiance efficiency of the transmission between the transmitter and the at least one power receiving apparatus is at least 20%.

In such a system, the overall radiance efficiency of the transmission between the transmitter and the at least one power receiving apparatus should be at least 30%.

Furthermore, either of the lost describes systems above may further include a voltage converter connected to the output of the optical-to-electrical power converter. In such a case, the voltage converter may be configured to track the maximum power point of the optical-to-electrical power converter. Additionally, the voltage converter may be a DC/DC boost voltage converter.

Yet other implementations may involve one of the above described systems wherein the resonator comprises at least one dielectric mirror.

Alternatively, the optical-to-electrical power converter may be a photovoltaic cell, in which case, the photovoltaic cell may comprise a III-V semiconductor material.

Further example implementations may involve a system such as those described above, and further including an energy storage device that may be a capacitor or a rechargeable battery.

Yet another advantageous implementation may be a system such as the above describes systems, and further including an inductor. In such a situation, the inductor may have an inductance between $$L = \frac{1}{1.28 * 10^{-40} * f} * E_{gain}^2 * \frac{1 - \frac{E_{gain}}{5 * 10^{-19} * V_{output}}}{P_{laser_{driver}}}$$

and $$L = \frac{1}{3 * 10^{-38} * f} * E_{gain}^2 * \frac{\left(1 - \frac{E_{gain}}{4 * 10^{-20} * V_{output}}\right)}{P_{laser\_driver}}$$

where f in the switching frequency measured in Hertz, $E_{gain}$ is the bandgap energy of the gain medium measured in Joules, $V_{output}$ is the output voltage of the DC/DC converter in volts and $P_{laserdriver}$ is the power measured in watts, supplied to the gain medium by the laser driver.

Yet other systems of the present disclosure may be those described hereinabove wherein the system is configured to receive information from the power receiving apparatus. This information may include at least one of battery status, device identification, power needs, voltage needs and a key.

Furthermore any of the above describes systems may further comprise a sensor for determining the temperature of the optical-to-electrical power converter. This sensor may then be configured to modify the power of the optical beam in response to changes in the temperature of the optical-to-electrical power converter. The temperature sensor output should be received by the controller.

According to yet another implementation described in this disclosure, any of such systems may further comprise an optical window positioned between the photovoltaic opticalto-electrical power converter and the beam steering apparatus. In such a case, the window may have a refractive index of at least 1.5, or even at least 1.6, and may be coated with an anti-reflective coating.

Additionally, in such systems, the second bandgap energy should be smaller than the first bandgap energy.

Furthermore, the controller should be adapted such that the beam steering apparatus directs the optical beam onto the at least one power receiving apparatus.

According to yet another implementation of the systems described in this disclosure, there is provided a system for optical wireless power transmission to at least one power receiving apparatus, the system comprising:

(i) an optical resonator having end reflectors and adapted to emit an optical beam, (ii) a gain medium comprising either a semiconductor device or a solid host doped with Neodymium ions and in optical communication with a filter attenuating radiation for at least one frequency having a wave number in the range 8,300 cm$^{-1}$ to 12,500 cm$^{-1}$, the gain medium being positioned inside the optical resonator and having a first bandgap energy, the gain medium being thermally attached to a cooling system and configured to amplify light passing through it, (iii) a driver configured to supply power to the gain medium, and enabling control of the small signal gain of the gain medium, (iv) a beam steering apparatus configured to direct the optical beam in at least one of a plurality of directions, (v) an optical-to-electrical power converter located in the at least one power receiving apparatus, and configured to convert the optical beam into electrical power having a voltage, the optical-to-electrical power converter having a second bandgap energy, (vi) a detector configured to provide a signal indicative of the optical beam impinging on the optical-to-electrical power converter, and (vii) a controller adapted to control at least one of the status of the beam steering apparatus and the driver, the controller receiving a control input signal at least from the detector, wherein the controller is configured to respond to an indication of a safety risk occurring in the system, by outputting a command to result in at least one of:

(a) causing the driver to change the small signal gain of the gain medium, (b) changing the radiance of the optical beam, (c) changing the power supplied by the driver, (d) hanging the scan speed of the beam steering apparatus, (e) changing the pose of the beam steering apparatus, and (f) recording the scan pose which defines the location of the optical-to-electrical power converter.

The term pose is understood to mean both the position and the angular orientation in which the beam steering apparatus directs the beam. Furthermore, the above-mentioned driver configured to supply power to the gain medium, is also understood to be able to control of the small signal gain of the gain medium either by varying the pump power input to the gain medium, or even by turning the driver completely on or off.

In such a system, the indication of a safety risk occurring in the system is obtained at least from the signal generated by the detector configured to provide a signal indicative of the optical beam impinging on the optical-to-electrical power converter, and from a signal generated by the level received at the resonator of the beam reflected from the at least one power receiving apparatus.

Any of the latter described systems may further include a voltage converter connected to the output of the optical-to-electrical power converter. Such a voltage converter should be configured to track the maximum power point of the optical-to-electrical power converter. Additionally, voltage converter may be a DC/DC boost voltage converter.

According to further implementations of such systems, the resonator may comprise at least one dielectric mirror. Furthermore, the optical-to-electrical power converter may be a photovoltaic cell, and such a photovoltaic cell may comprise a III-V semiconductor material.

Yet another implementations of such systems may further include an energy storage device that may be a capacitor or a rechargeable battery. Additionally, they may further include an inductor. Such an inductor may have an inductance between $$L = \frac{1}{1.28 * 10^{-40} * f} * E_{gain}^2 * \frac{1 - \frac{E_{gain}}{5 * 10^{-19} * V_{output}}}{P_{laser_{driver}}}$$

and $$L = \frac{1}{3 * 10^{-38} * f} * E_{gain}^2 * \frac{\left(1 - \frac{E_{gain}}{4 * 10^{-20} * V_{output}}\right)}{P_{laser\_driver}}$$

where f in the switching frequency measured in Hertz;

$E_{gain}$ is the bandgap energy of the gain medium measured in Joules;

$V_{output}$ is the output voltage of the DC/DC converter in volts; and $P_{laserdriver}$ is the power measured in watts supplied to the gain medium by the laser driver.

Furthermore any of such systems may be configured to receive information from the at least one power receiving apparatus. Such information may include at least one of battery status, device identification, power needs, voltage needs and a key.

The systems may further comprise a sensor for determining the temperature of the optical-to-electrical power converter. Such a system may be configured to modify the power of the optical beam in response to changes in the temperature of the optical-to-electrical power converter. In order to perform this, the temperature sensor output should be received by the controller.

Additional examples of such systems may further comprise an optical window positioned between the photovoltaic optical-to-electrical power converter and the beam steering apparatus. Such a window may have a refractive index of at least 1.5, or it may have a refractive index of at least 1.6, and it may be coated with an anti-reflective coating.

Finally in any of the above described systems, the second bandgap energy should be smaller than the first bandgap energy.

In many situations, it is necessary to limit the maximal power emitted by the system, to prevent exceeding some maximal value which may be derived from safety requirements of the system, from engineering requirements of the system, from the receiver's power requirements (which may dynamically change) or from other issues. In such a case, when the optical beam exceeds a certain power the system may reduce the small signal gain of the gain medium which will result in lowering of the radiance emitted by the system.

Consequently, according to yet further implementations, such systems may further include a power sensor disposed such that it provides a signal indicative of the power carried by the optical beam before impingement on the at least one power receiving apparatus. In such a situation, the driver may be configured to reduce the small signal gain of the gain medium when the power indication of the power sensor exceeds a threshold.

Additionally, one important indication of safety risk is "lost power", an estimation of the power unaccounted for by the system. Such power may be lost to system inefficiency but may also be lost to power emission in a risky manner. If such "lost power" is detected, the system should perform various operations to ensure safe operation, which may include reducing the beam's power, reducing the small signal gain, reducing the system's radiance, diverting the beam or informing the user. Therefore, the detector may also provide a signal indicative of the power received by the at least one power receiving apparatus. In this case, at least one of the indications of safety may come from a difference between the power indicated by the power sensor and the power indicated by the detector in one of the at least one power receiving apparatus. At least one of the indications of safety may then arise from the difference exceeding a threshold.

Other safety hazard indications may come from a beam penetration sensor, which may be optical, or from system integrity sensors such as watchdogs, interlocks, thermistors, which may indicate that the system is not safe. In such a case, the system may perform a safety operation such as reducing the beam's power, reducing the small signal gain, reducing the system's radiance, diverting the beam or informing the user.

Therefore, further implementations of the above-described systems may include a beam penetration sensor adapted to sense when an unwanted object enters the optical beam, the entry of the unwanted object constituting an indication of a safety risk. Alternatively and additionally, such systems may further include an enclosure integrity sensor, wherein a warning issued by the sensor of lack of integrity of the enclosure indicates a safety risk. Such systems may also include a sensing device for sensing a deviant operation of at least one critical subsystem in the system, the deviant operation constituting an indication of a safety risk.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

The present invention will be understood and appreciated more fully from the following detailed description, taken in conjunction with the drawings in which:

FIG. 4 shows a Poly-methyl methacrylate (PMMA) chain;

FIG. 5 shows the structure of a polycarbonate;

FIG. 6 shows the polystyrene structure;

FIG. 7 shows the structure of nylon 6,6;

FIG. 8 shows a polypropylene chain structure;

FIG. 9 shows the polyethylene chain structure;

FIG. 20 is a schematic view of the optical-to-electrical power converter of the systems shown in FIGS. 16, 19;

FIG. 21 shows a block diagram view of the safety system of FIG. 19;

DETAILED DESCRIPTION

Figure 1:
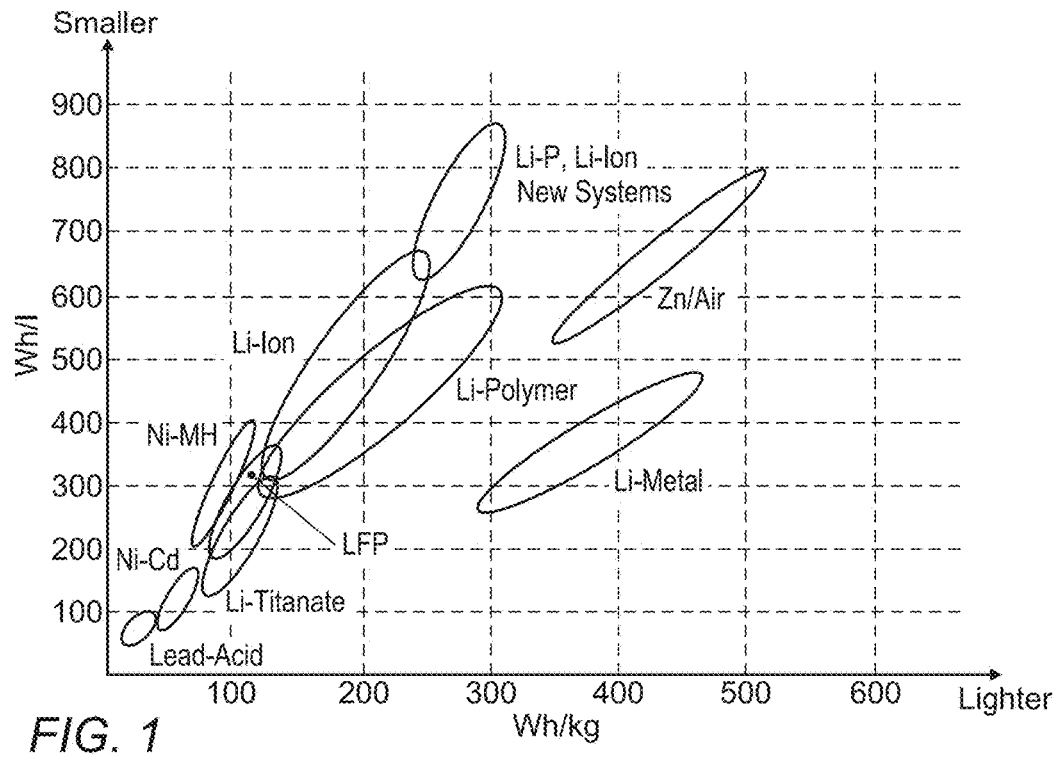
FIG. 1 shows the energy density of various battery chemistries.
Figure 2:
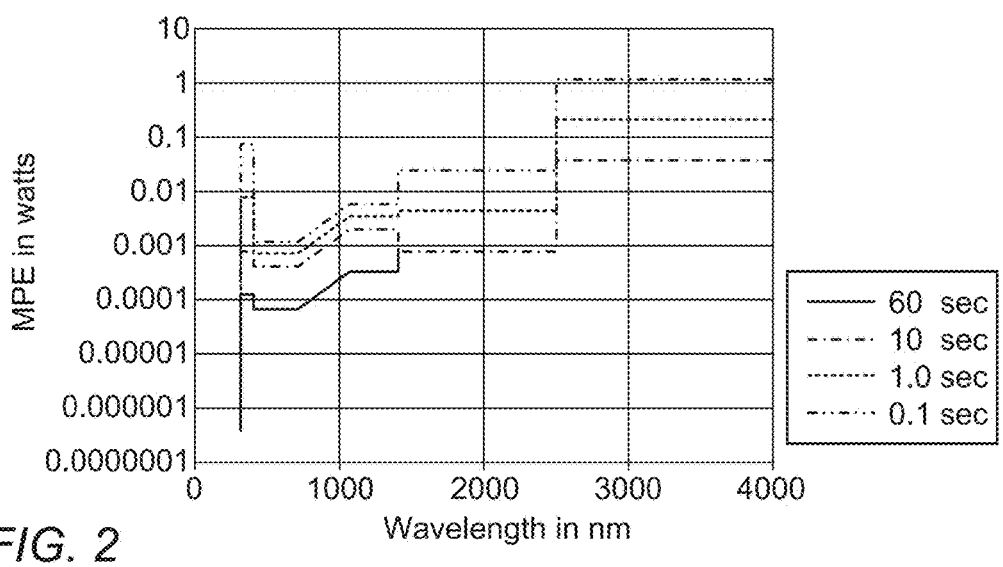
FIG. 2 shows the maximal permissible exposure value for lasers for various exposure times, according to the US Code of Federal Regulations, title 21, volume 8, (21 CFR §8), revised on April 2014, Chapter I, Subchapter J part 1040.
Figure 3:
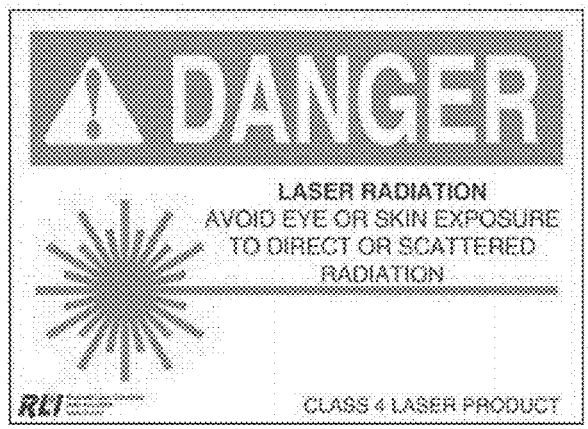
FIG. 3 shows an example of a warning sign for a class IV laser product.
Figure 4:
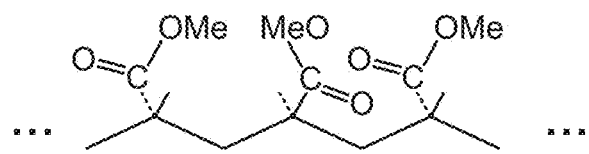
FIGS. 4, 5, 6, 7, 8, and 9 show examples of the chemical composition of various commonly used transparent polymers.
Figure 5:
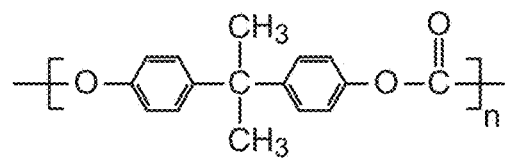
Figure 6:
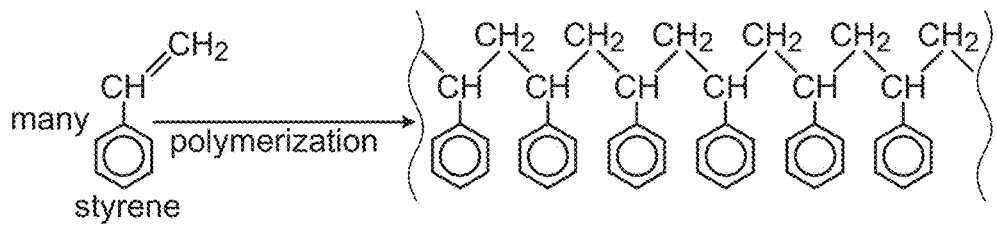
Figure 7:
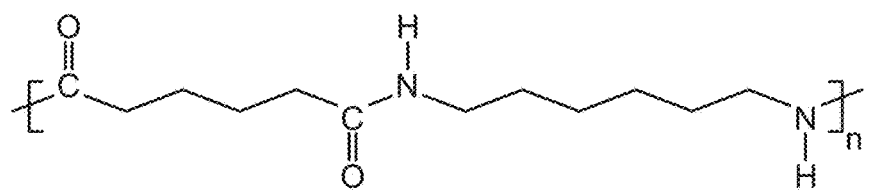
Figure 8:
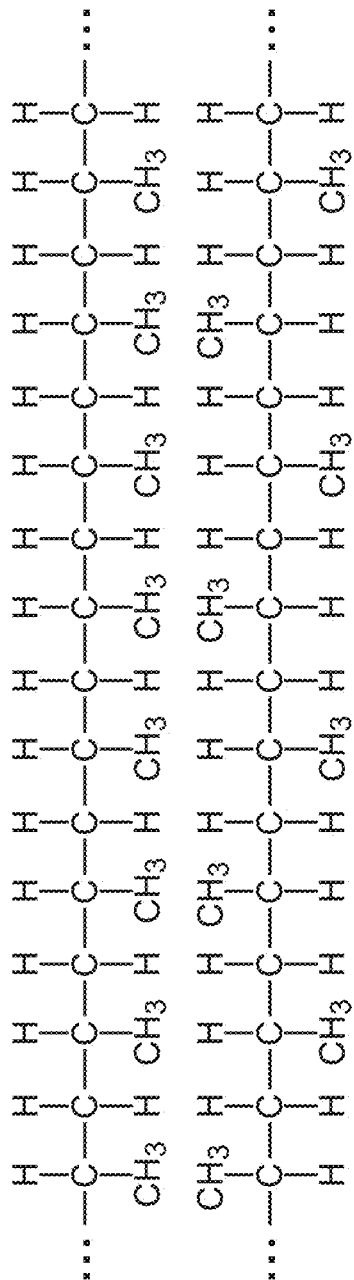
Figure 9:
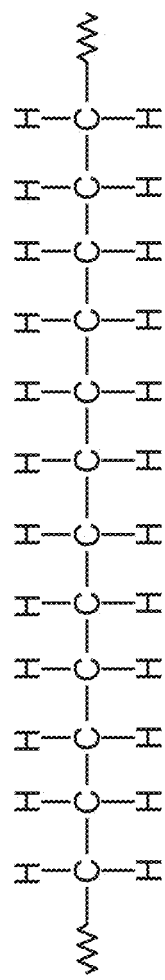
Figure 10:
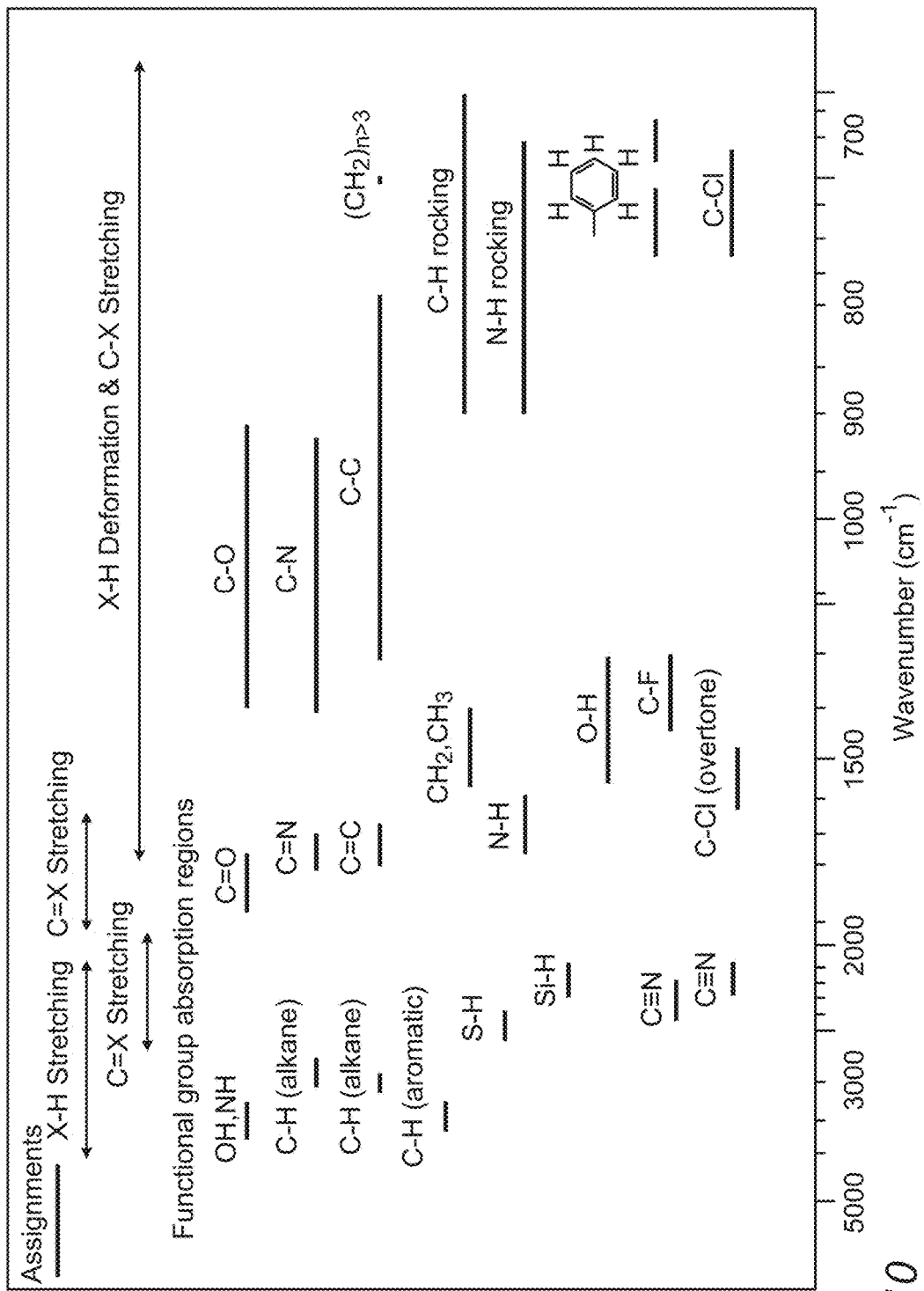
FIG. 10 shows the IR absorption bands for common organic chemical bonds.
Figure 11:
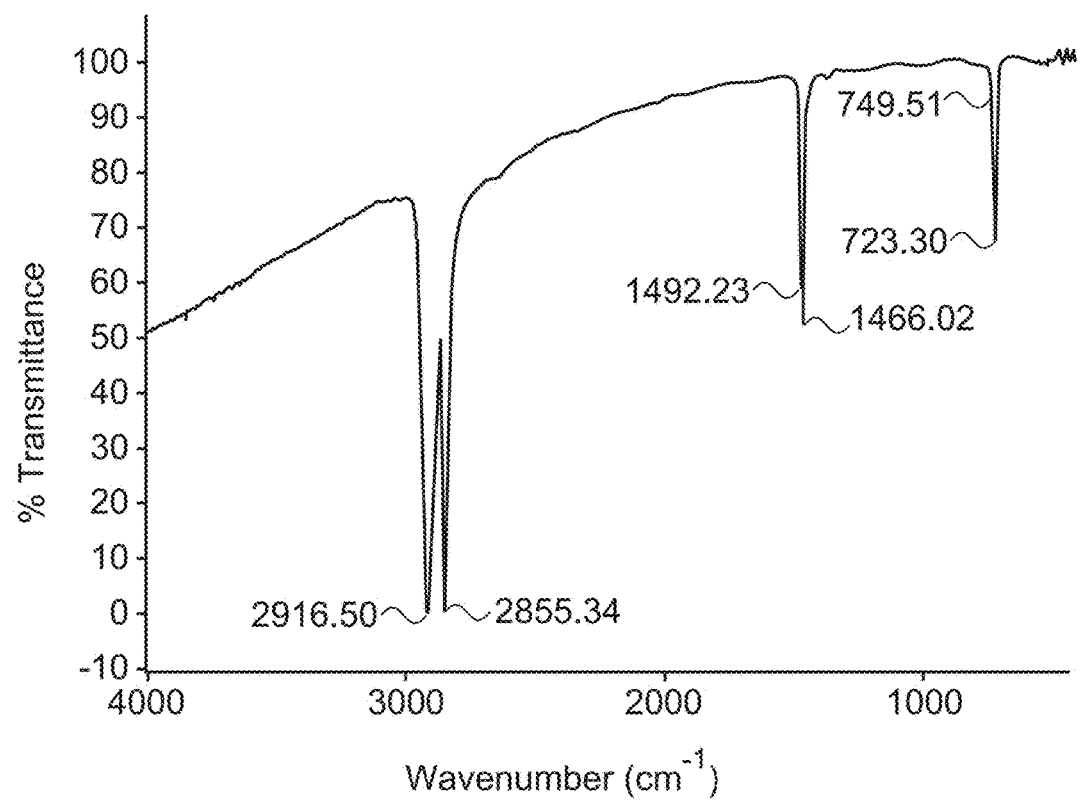
FIG. 11 shows the IR absorption spectrum of polyethylene.
Figure 12:
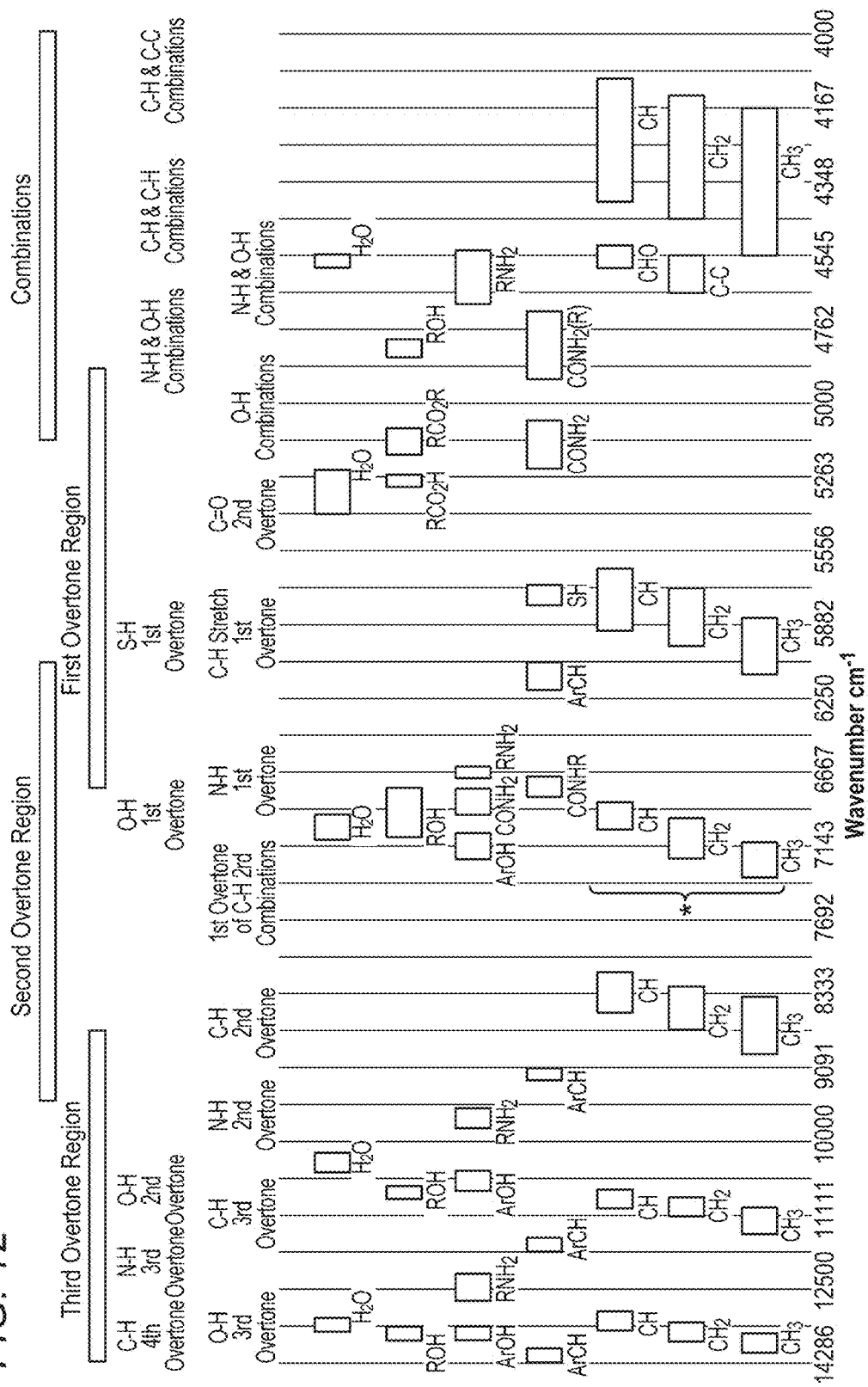
FIG. 12 shows the overtone absorption bands for some common organic chemical bonds.

In view of the above described considerations, one exemplary implementation of the optical wireless power supply systems of the present disclosure could be a system tuned to work in between the first overtone of the C—H absorption at 6940 cm$^{-1}$ and the second overtone of the C—H absorption at 8130 cm$^{-1}$. Such overtone bands are less known bands, containing much less chemical information, and arise from essentially forbidden quantum mechanical transitions, and are only allowed due to complex mechanisms. Consequently, they provide wide, weak absorption bands, exactly as preferred for this application, but have found significantly less use in analytical chemistry. The broad nature of the bands allows for detecting various different polymer compositions, while the weak absorption allows the system to continue operation even in the vicinity of organic dirt and fingerprints. This makes these lines significantly less useful for typical uses of absorption measurements, but ideal for the present task. Another advantage of these lines is that there are no commonplace absorption lines directly positioned at the same frequencies, so that changing chemical composition of the materials will not alter the measurement results strongly. Many such overtone bands are illustrated in the chart of FIG. 12.

Electro-optical components that operate in that band are scarce and hard to source, probably since both diode lasers and diode-pumped, solid state (DPSS) lasers are significantly less efficient at those frequencies, and only lower power lasers are currently commercially available. Since lasers at the preferred frequencies, with the desired parameters, are, not currently available, a laser suitable for this use has to be designed from the ground up. The resonator and gain medium have to be designed. A laser with the selected frequency and a radiance value sufficient to facilitate a roughly collimated or nearly collimated beam must be constructed. To achieve good collimation of the beam, a radiance of at least 8 kW/m$^2$/Steradian is needed, and even 800 kW/m$^2$/Steradian may be needed for higher power systems for efficient power transmission. For small systems working at long distances, much higher radiance (up to 10 GW/m$^2$/Steradian) may be designed in the future, according to similar principles. Receivers for use with radiance of less than that level need to be too large, which would make the system cumbersome.

Different mirror setups for the resonator have been used, specifically good quality metallic mirrors made of Gold, Silver or Aluminum. These are found to reduce the lasing efficiency significantly. Much better results are achieved with dielectric material mirrors. Alternatively, Fresnel mirrors have one advantage in that they are low cost. Other mirrors that may be used are Bragg mirrors (which may be dielectric). The mirrors need to be positioned so as to form a stable, or a nearly stable resonator, or a resonator where photons are confined in space by a barrier inside the laser (such as in a fiber or diode laser) and a gain medium should be placed in the resonator between the mirrors in a position allowing the gain medium to amplify the beam resonating inside the resonator, such that it has a radiance of at least 8 kW/m$^2$/Steradian.

If the gain medium is capable of lasing at more than one wavelength, the dielectric mirrors can be selected to limit that wavelength to a specific value. Alternatively, a filter can be used to fix the lasing frequency.

Specifically, it is better if the mirrors have high reflectivity for at least one wavelength between the first overtone of the C—H absorption at 6940 cm$^{-1}$ and the second overtone of the C—H absorption at 8130 cm$^{-1}$.

Three different approaches may be used for the gain medium:
1. DPSS Design
    In the DPSS design, the gain medium may be a Nd-doped YAG crystal, though YVO$_4$ crystals, GGG crystals and Glasses are also options for a clear host. Neodymium is most suitable for operation between the first overtone of the C—H band and the second overtone of the C—H band since Nd has a transition near ~7450 cm$^{-1}$. The Nd ions need to be excited by absorbing radiation, typically from 808 nm laser diodes, although other wavelengths may be used. A Nd-based gain medium tends to lase at a much higher frequency unless a filter blocking the transition around 9400 cm$^{-1}$ is added inside the resonator, or unless the unwanted radiation from the resonator is otherwise extracted. When such a filter is added, lasing commences at 7440-7480 cm$^{-1}$. Such filter action can be achieved using a prism or a grating, instead of a filter or by proper chromatic design of the laser resonator.
2. Semiconductor Laser
    As an alternative, a semiconductor-based design may be proposed. It is possible to tune the wavelength of semiconductor lasers by altering the lasing bandgap of the semiconductor used. Semiconductors, especially those of the III-V type and more especially, though not exclusively, quantum dot types, having bandgaps of the order of 1 eV, emit light at the desired frequencies between 6900 cm$^{-1}$ and 8200 cm$^{-1}$. Specifically bandgaps between 0.8 eV and 1.1 eV yield good results and are absorbed, at least partially, by essentially all commonly used polymers.
3. Various alternative designs may also be used in the systems described in this disclosure, such as Nd doped fiber lasers, that may include Bragg mirrors and/or fiber loop mirrors. Alternatively Raman shifted fiber lasers may also be used.

During operation, the gain medium heats up, and should be cooled to prevent wavelength shift and efficiency degradation. If the gain medium is properly cooled, then it is possible to increase the pump power or current until a beam having radiance of at least 8 kW/m$^2$/Steradian is emitted, having a frequency between 6900 cm$^{-1}$ and 8200 cm$^{-1}$. Such a beam can be nearly collimated and will be attenuated by most organic materials, including polymers, allowing detection. However, it will not be strongly absorbed by contaminations such as fingerprints.

The laser gain medium is typically configured to work at a temperature below 150 degrees centigrade. If its temperature exceeds a level, typically around 250 centigrade, a number of problems may arise.

Firstly, the efficiency of light emission may drop significantly, due to population of lower level excited states, especially in 3- and 4-level lasers, and also due to thermal recombination of charge carriers in semiconductors.

Secondly, the soldering of the gain medium, if such a thermal attachment method is used, may be damaged.

Thirdly, thermal aberrations may occur which may cause beam degradation

Fourthly, the thermal expansion of the laser gain medium may be different from that of its surroundings, which may cause mechanical stress or even warping and fracture of the gain medium.

For those reasons, inter alfa, the gain medium has to be thermally attached to a cooling system. Typically the gain medium emits between 0.1 and 100 W of heat from a surface that is between 1 mm$^2$ and 40 mm$^2$. In order for the temperature of the gain medium to be maintained at less than 150 degrees, the cooling system of the gain medium needs to have a thermal resistance of less than 200 Kelvin per Watt, and for systems transmitting higher powers, typically arising from more than 10 W of electrical power input, the thermal resistance should be significantly lower, and in many cases thermal resistance lower than 0.05 Kelvin/Watt is needed.

The surface of the cooling system is attached to the gain medium, typically using a third material such as solder or adhesive, which must have an expansion coefficient that is compatible to both the expansion coefficient of the gain medium itself and to the expansion coefficient of the front surface of the cooling system.

Typically such cooling systems may be either a passive heat sink, a heat sink with a fan, a Peltier element connected to a heat sink with or without a fan, or a liquid cooled cooling system. Alternatively, use may be made of a stand-alone liquid circulating cooling system with active circulation based on a circulating pump, or with passive circulation, based on heat pipes.

If the cooling system comprises a heat sink with a fan, its thermal resistance should be less than 0.1° Kelvin per Watt If the cooling system is a passive heat sink, its thermal resistance should be less than 0.3° Kelvin per Watt If the cooling system is a Peltier element, it needs to generate at least 5 degrees temperature difference $\Delta T$.

If the cooling system is an active liquid cooled cooling system, it should be able to cover the entire span of thermal resistances mentioned here.

A passive heat sink is preferred in systems designed for low cost and quiet operation, while a liquid cooled system is preferred for high-power systems. A heat sink with a fan or a fluid pump is used for systems typically having more than 1 W electrical output and a transmitter having a small volume, such as less than approximately 1 liter.

The gain medium is typically driven by a driver, supplying it with power, which may be provided as electrical power as in the case of some semiconductor gain media, or optical as in the case of other semiconductor gain media or DPSS systems, or chemical or other forms of energy. The amount of power supplied by the driver determines the small signal gain achieved, which determines the working conditions and emission of the laser, while the saturated gain of the gain medium is generally a function of the material selected for the gain medium, though not always in a simple linear fashion, and ultimately, the radiance emitted from the laser. Such a laser driver might have two or more operational states, one used for power transmission, and the others used for other functions of the system, such as target seeking, setup, and information transmission. It is important that the laser driver produces stable emission (with regards to power and beam parameters) in both working conditions, although stable operation during power transmission is more important.

To convert the optical beam into electricity again, so that useful power is delivered, an optical-to-electric power converter, typically a photovoltaic cell, should be used. As with the lasers, suitable photovoltaic cells tailored to the frequency of the beam used, are not commonly available as off-the-shelf components, and a custom cell is required. The bandgap of the photovoltaic semiconductor should be slightly smaller than the bandgap of the gain medium used, so that the beam frequency is absorbed efficiently by the semiconductor. If not, the conversion efficiency will be very poor. On the other hand, if the bandgap used is too small, then a poor efficiency system is achieved. Also the conductors on the photovoltaic cell need to be tailored to the radiance of the beam used—the higher the radiance, the thicker the conductors needed.

Since the bandgap of the laser gain medium should be in the range 0.8-1.1 eV, and the bandgap of the photovoltaic cell used must be lower, and since a single junction photovoltaic cell typically produces a voltage that is about 60-80% of the bandgap energy divided by the electron charge, a single junction cell tailored to the laser frequency yields a very low voltage, typically 0.3-0.8V, and typically a high current, assuming an output power of a few watts, as required by a practical system. The conductors on the semiconductor need to be thick enough to carry the generated current without significant (e.g. >5%) losses. Typically the series resistance of the conductors needs to be below 1 Ohm, or even better, below 0.1 Ohm, and the heat generated should be efficiently extracted from the photovoltaic cell as its efficiency generally decreases with temperature.

This combination of low voltage combined with high power cannot be easily converted to the higher voltages required to charge portable devices, typically 3.3 or 5V. Furthermore, some systems, such as communication systems, may require voltages such as −48V, 12V or 3.8V. The system needs to supply a stable voltage, and at higher levels than the output voltage expected from the photovoltaic cells. A typical method to increase the voltage of photovoltaic cells is to connect them in series, such as is described in U.S. Pat. No. 3,370,986 to M. F. Amsterdam et al, for "Photovoltaic Series Array comprising P/N and N/P Cells", which shows a typical configuration for yielding a higher voltage, while utilizing almost the same amounts of semiconductor and no additional components, and is therefore the typically chosen solution.

However this solution is not suitable for systems such as those described in the present application, in which a laser having a radiance as high as 8 kW/m$^2$/Steradian is used, especially since such a laser typically does not have a uniform shaped beam. Furthermore, its beam shape may be variable in time and the pointing accuracy may be less than optimally desired. In such a situation it is virtually impossible to design a compact and efficient system that will illuminate all the cells uniformly. If the photovoltaic cells connected in series are not uniformly illuminated, they do not produce the same current. In such a case the voltage will indeed be increased to the desired level but the current would drop to the current generated by the cell producing the least current, usually the cell least illuminated. In such a situation efficiency will be very poor. There is thus a need for an improved alternative method to increase the voltage.

One method of increasing the voltage of a single cell may be by charging capacitors in parallel, and then discharging them in series. This method yields good results for low currents, but when current is increased beyond a certain level, the switching time becomes a dominant factor, influencing efficiency, which degrades with increasing switching time.

If the energy is converted to AC using a fast, low resistance, switching mechanism, that AC current can be amplified using coupled inductances and then converted to AC again. The increased voltage AC can be converted to DC using a diode bridge and an energy storage device, such as a capacitor or a battery. Such systems have advantages when the voltage needs to be increased beyond twenty times that of the photocell voltage. Another advantage of such a system is that the switching can be done from the transmitter using the laser, thus saving receiver cost and complexity. Such systems have disadvantages when the voltage needs to be increased by a factor of less than 10 or when size and volume limitations are critical to the application.

Figure 13A:
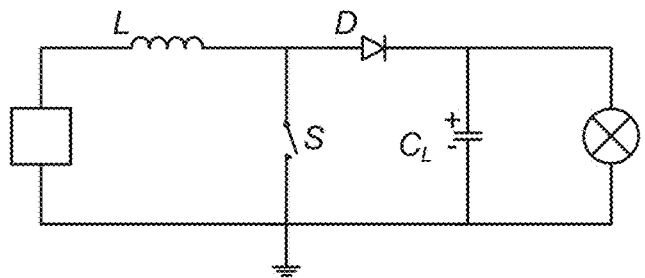
FIGS. 13A and 13B show different electronic configurations for converting the output voltage of a photovoltaic cell to a different voltage.

Reference is now made to FIG. 13A, which shows a method of voltage conversion that is efficient and simple. In the configuration of FIG. 13A, a single inductor may be used with a low resistance switching mechanism and an energy storage device to increase the voltage of the photovoltaic cell. In FIG. 13A, the square on the left is the photovoltaic cell, the switch S, is a low resistance switch, such as a MOSFET, JFET, BJT, IGBT or pHEMT, the inductance L is connected to the output of the photovoltaic cell and the capacitor C acts as an energy storage device.

The following description assumes for simplicity the use of components with zero resistance. Taking resistance losses into account complicates the calculations, and is explained in a later section of this disclosure. The switching mechanism cycles the inductor between two primary operating phases: charging phase and discharging phase. In the charging phase the inductor is connected in parallel with the photovoltaic cell, by the closing of switch S. During this phase the inductor is being charged with the energy converted by the photovoltaic cell. The inductor energy increase is given by:

$$\Delta E_{L\_CH} = Vpv * I_L * T_{CH}$$

Where:
Vpv is the output voltage of the photovoltaic cell;
$I_L$ is the average inductor current; and
$T_{CH}$ is the duration of the charging phase.

In the discharging phase, the inductor is connected between the photovoltaic cell and the load by the opening of switch S. During this phase, the energy delivered from the inductor to the output energy storage device is given by the inductor energy decrease:

$$\Delta E_C = Vo * I_L * T_{DIS}$$

Where:
Vo is the voltage of the energy storage device, which is typically very close to the desired output voltage of the device, and can therefore be approximated as the output voltage of the system;
$I_L$ is the average inductor current; and
$T_{DIS}$ is the duration of the discharging phase.

The energy delivered from the photovoltaic cell to the inductor during that phase is given by: $\Delta E_{L\_DIS} = Vpv * I_L * T_{DIS}$.

The change in the inductor energy during that phase is the difference between the incoming and outgoing energy:

$$\Delta E_{L\_DIS} = Vpv * I_L * T_{DIS} - Vo * I_L * T_{DIS}.$$

In steady state operation, the energy of the inductor at the end of the cycle returns to the same value it was at the beginning of the cycle yielding $$\Delta E_{L\_CH} = -\Delta E_{L\_DIS},$$

Which, after substitution, yields:

$$Vo = Vpv * (1 + T_{CH}/T_{DIS}).$$

The voltage at the energy storage device is thus defined by the photovoltaic cell voltage and the ratio of the charging and discharging phase durations.

In the present system, however, the parasitic characteristics and other aspects of the components might have a significant impact on conversion operation and efficiency and care should be taken into account in selecting and using the right components, in order to allow the system to operate efficiently. These elements are now considered, one by one:

Inductor

The inductance of the inductor defines the rate of change of the inductor current due to applied voltage, which is given by dI/dt=V/L, where dI/dt is the rate of current change, V is the voltage applied across the inductor and L is the inductance. In the context of the current system, V is determined by the gain medium in the transmitter. Selection of a different gain medium causes change in the photon energy, which mandates consequent changes in the photovoltaic bandgap, and hence a change in the photovoltaic voltage. This then calls for selection of a different inductor and/or switching frequency. The switching rate must be fast enough to allow the inductor current to respond to changes in the incoming power from the transmitter through the optical-to-electrical power converter, and slow enough to avoid high-magnitude current ripple which contributes to power loss, input voltage ripple and output voltage ripple. The optimal value of the inductor should yield ripple current which is between 20% and 40% of the maximum expected input current, but systems may be operable between 10% and 60%. Rigorous analysis of the circuit parameters shows that in order to achieve this objective, the value L, of the inductor measured in Henries, must be within the limits:

$$L < \frac{1}{1.28 * 10^{-40} * f} * E_{gain}^2 * \frac{1 - \frac{E_{gain}}{5 * 10^{-19} * V_{output}}}{P_{laser\_driver}}$$

$$L > \frac{1}{3 * 10^{-38} * f} * E_{gain}^2 * \frac{\left(1 - \frac{E_{gain}}{4 * 10^{-20} * V_{output}}\right)}{P_{laser\_driver}}$$

Where:
f is the switching frequency measured in Hz;
$E_{gain}$ is the bandgap of the gain medium, measured in Joules;
$V_{output}$ is the output voltage from the voltage converter, measured in Volts; and
$P_{laser\_driver}$ is the power pumped by the laser driver into the gain medium, measured in Watts.

In order to successfully integrate the inductor into a mobile client, the inductance should typically be smaller than 10 mH, as inductors that are suitable for the current required by mobile client charging and having volume limitations suitable for a portable application are typically well below this value. Also inductors having inductances too small, such as 10 nH, will require such a high switching frequency that it will severely limit the availability of other components in the system such as the switch, and the switching loss caused by such a high frequency may be higher than the amount of power delivered by the photovoltaic cell.

The serial resistance of the inductor, $R_{parasitic}$, should be as low as possible to minimize the conduction power loss: Typically, a value which yields less than 10% efficiency drop is chosen: the serial resistance of the inductor, measured in Ohms should be less than $$R_{parasitic} \le \frac{1}{2 * 10^{-40}} * \frac{E_{gain}^2}{P_{laser\_driver}}$$

Where:
$E_{gain}$ is the bandgap of the gain medium, measured in Joules; and
$P_{laser\_driver}$ is the power pumped by the laser driver onto the gain medium, measured in Watts.

In a typical system the inductor serial resistance would be less than 10Ω. The saturation current of the inductor is usually chosen to be higher than the expected inductor peak current, given by:

$$I_{SAT} > I_{PEAK} = Im + Vpv * (1 - Vpv/Vo)/(2*L*f)$$

For extracting more than 10 mW of power from a single junction photovoltaic cell, the saturation current must be higher than 10 mW/0.8v=12.5 mA.

For reliable operation the inductor shall be rated at a higher current than the expected maximum input current. For extracting more than 10 mW of power from a single junction photovoltaic cell, the inductor rated current must be higher than 10 mW/0.8 v=12.5 mA.

Switching Mechanism

The switching mechanism is usually made of two or more devices. The first device, a main switch, when conducting, sets the inductor into the charging phase. The second device can be either a diode (as in FIG. 13A) or a switch whose function is to connect the inductor to the load or output energy storage device, during the discharging phase, and to disconnect it from the load during the charging phase.

The switching mechanism should have low switch node capacitance to minimize switching losses:

$$P_{SW2} = 0.5 * Csw * Vo^2 * f$$

For extracting more than 50% of the laser power, the switch node capacitance should be less than:

$$Csw \leq \frac{P_{laser\ driver}}{V_o^2 * f}.$$

In a typical system switch node capacitance would be less than 100 nF and more than 10 pF.

The serial resistance of the main switch in the switch node, that switch being either that connecting the inductor to the ground or that connecting the optical-to-electrical power converter to the inductor, should be less than:

$$R \leq \frac{E_{gain}^2}{2 * 10^{-40} * P_{laser\ driver}}$$

In a typical system the switch serial resistance would be less than 10Ω.

Energy Storage Device

The energy storage device can be either a capacitor or a battery or both.

The energy storage device is required to maintain the output voltage during the charging phase, when the inductor is disconnected from the output. The capacitance of the storage device is chosen based of the switching frequency, laser power and the desired output ripple voltage:

$$C_{OUT} > P_{LASER\ DRIVER}/(f * Vo * \Delta Vo)$$

Where ΔVo is the desired output ripple voltage.

The energy storage device can also supply power to the load during temporary interruption of the optical path. For uninterrupted power supply, the energy storage device should be able to store at least the amount energy equal to minimal operational output power ($P_{OUT\_MIN}$) multiplied by the interruption time interval ($T_{INT}$):

$$E_{OUT\_MIN} \geq P_{OUT\_MIN} * T_{INT}$$

If a capacitor is used as the energy storage device, the capacitance should be larger than: $C_{OUT} \geq 2 * E_{OUT}/V_{OUT}^2$.

For uninterrupted operation at minimal operational output power larger than 10mW and interruption time interval longer than 100 ms the stored energy has to be larger than 1 mJ and the capacitance larger than 80 µF (assuming $V_{OUT}=5V$).

In some cases, the capacitor may serve as the energy storage device for the client application. In such cases, the client application may be designed without any secondary energy storage device (the conventionally used battery installed in the mobile device), and the energy storage device of the presently described systems would have to store enough energy to supply the power needs of the client device until the next charging event. In such cases, super capacitors having a capacitance at least 0.5 F, and even above 10 F, may be used. In other cases, where the power requirement of the client device is low, or when it has an independent energy storage device such as the battery internally installed in the device, or if the device does not need to operate when no power is supplied, the capacitor used would typically be well beyond 1 F. If a rechargeable battery is used as the energy storage device, then, similar to the capacitor logic above, if the battery is used only as means of regulating the voltage, but not as the means for maintaining power supply to the client device between charging events, then the energy capacity of the battery may advantageously be up to 100 times the energy supplied during 100 cycles of the switch (typically below 0.1 Wh), this level being determined according to the volume budget and cost effectiveness of the battery. On the other hand, if the battery is also used to power the client device between charging events, its capacity should be at least large enough to store the energy needed by the client device between charging events—typically above 0.1 Wh in the case of a cellular phone. Batteries also have a volume limitation depending on the product in which they are intended to be used. Thus, the battery of a product that has some volume V, if incorporated externally to the device, would typically be limited to up to times the volume of the device, i.e. 3V. As an example of this rule of thumb, a battery used to power a cellular phone of 100 cc. volume would typically be limited to less than 300 cc. in volume. Such a battery would typically have a capacity of below 300 Wh. because of the above mentioned limitation.

Figure 13B:
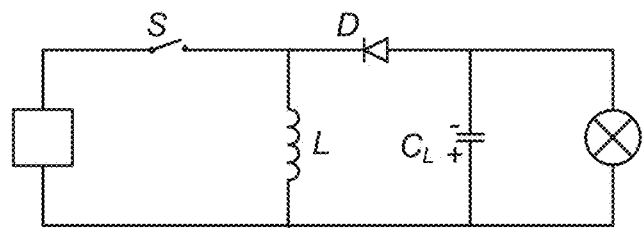

The circuit in FIG. 13A is not the only possible topology. FIG. 13B shows a different design that can achieve similar performance characteristics. The components roles, constraints and expected values for FIG. 13B are the same as those listed for the circuit in FIG. 13A. The primary difference is that the positive and negative terminals of the output voltage are reversed.

In some applications the energy storage device may be preferably located inside the device which is intended to use the power received. In other applications, specifically those applications where short term operation is anticipated, and which does not require a regulated voltage, the energy storage device may even be eliminated.

Point of Regulation

The power output of the photovoltaic cell depends on the incoming optical power and load applied to it. The optimal loading condition will yield the maximal output power from the photovoltaic cell, therefore, the control mechanism of the voltage converter must regulate the loading point. The control mechanism can be either designed to maintain constant voltage between the cell terminals, which is known to be maximum power operating point for most conditions, or it can track the maximum power operating point by measuring the cell output power and seeking the optimal cell voltage under any operating condition. The first approach is simpler; the second is more power efficient.

The generated laser beam needs to be directed towards the receiver. In order to direct the beam towards the receiver, a beam steering apparatus should be used. Some beam steering sub-systems that could be used include a moving mirror, a moving lens, an electro-optical modulator, a magnetooptical modulator, a set of motors moving the whole transmitter system in one or more directions, or any other suitable beam deflection device.

The beam steering apparatus should be controlled by a controller, most conveniently the same controller used to control the laser driver.

The beam steering apparatus is configured to direct the >8 kW/m²/Steradian beam in any of a number of directions.

The damage threshold of the beam steering apparatus needs to be able to withstand the beam's radiance.

For example, if the beam is focused on a mirror using a focusing mechanism having a numerical aperture of 0.5, the mirror needs to withstand a power density of at least 6.7 kW/m² for a beam having 8 kW/m²/steradian. If a beam having higher radiance is used the mirror should be chosen so that it would have a higher damage threshold correspondingly.

Figure 14:
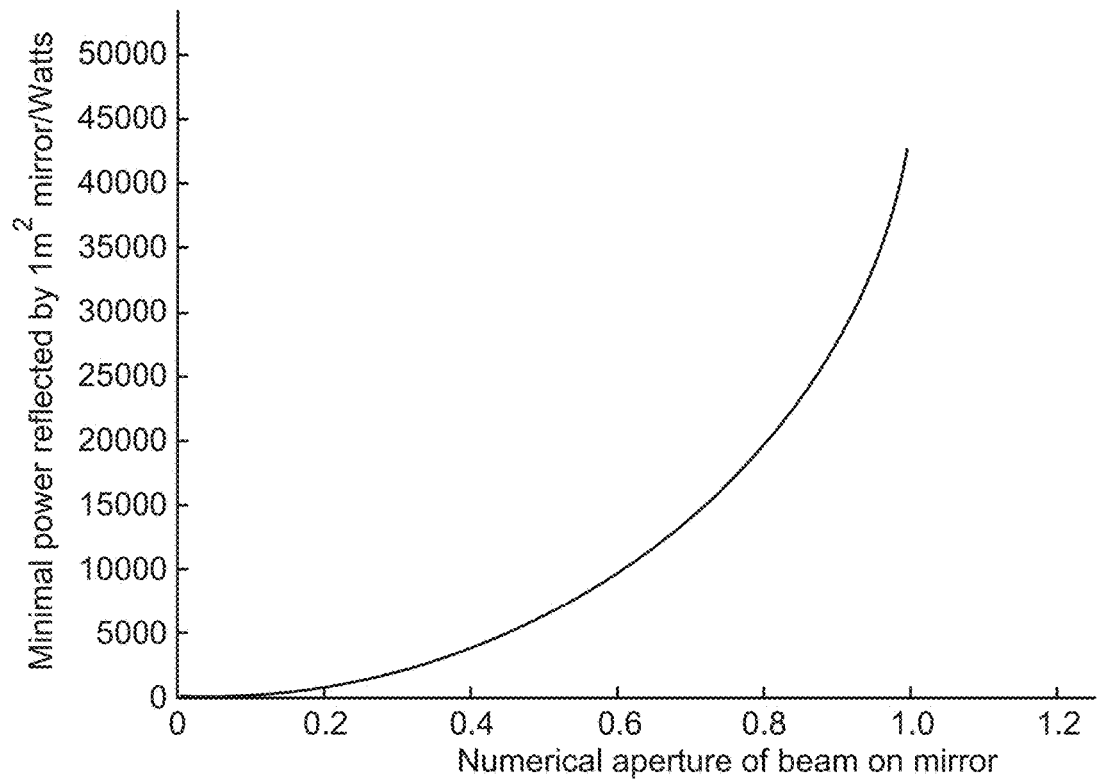
FIG. 14 shows the power reflected per square meter by a mirror, when a beam of radiance 8 kW/m$^2$/steradian is focused upon it, as a function of numerical aperture.

FIG. 14 shows the power reflected per square meter by a mirror when a beam of 8 kW/m²/steradian is focused upon it as a function of numerical aperture.

If a higher radiance beam is used, then the power reflected by the mirror increases correspondingly in a linear manner.

Since the beam may be far from uniform, "hotspots", sometimes having 10× irradiance compared to the beam average, may be generated.

Hence, mirrors should have a damage threshold which is at least as large and preferably at least 10× that shown in FIG. 14, scaled to the actual beam irradiance and numerical aperture of the focusing mechanism on the mirror.

There is typically an optical front surface in the receiver, positioned near the photovoltaic cell and between the photovoltaic cell and the transmitter, through which the beam enters the receiver, and which is needed in order to protect the typically delicate structure of the photovoltaic cell, and in many cases, in order to match the exterior design of the device where the power receiver is integrated in. The front surface may have a coating protecting it from scratches, such as Corning Gorilla Glass®, or similar, or may be treated to make it better withstand scratches. It may be also be treated to reduce the levels of contaminants, such as fingerprints and dust which may settle on it, or to reduce their optical effect, or it may be coated with an anti-reflection coating to reduce the level of light reflected from it. The front surface of the photovoltaic cell may also be coated. In some cases the front surface would be part of the structure of the photovoltaic cell itself or coated on the photovoltaic cell.

While in some situations, it may be possible to reduce the amount of reflection from the surface to below the safety threshold, by choosing a very low reflection anti-reflective coating, should the coating be contaminated or covered by either a liquid spilled on it, or a fingerprint, such anti-reflective coating would be ineffective in reducing the amount of reflection, and typically, 3-4% of the incident light will be reflected in an uncontrolled direction. If such a reflection is reflected in a diverging manner, its power density would soon drop to safe levels. However, should the reflection be focused, the power density may increase to unsafe levels. For this reason, it is important that the ROC (radius of curvature) of such a surface, at any point on it, should not be less than a predetermined value. In general, the reflection from the surface is intended to be only a small part of the incident light, thereby reducing the danger of any significant beam reflections, regardless of what nature or of what form the surface curvature takes. The level of reflected light may be variable, since even the ~4% reflection from an untreated glass surface may be increased, if a layer of extraneous contaminant material on the surface generates increased reflectivity. However, that reflection is expected not exceed 20%, and will generally be substantially less than the 4% of untreated glass, such as in the case of AR coated glass, where reflectivities of 0.1% or even less are common. Therefore, the surface is described in this disclosure, and is thuswise claimed, as having properties which reflect a small part of the incident light, this description being used to signify less than 20% of the incident light, and generally less than the 4% of untreated glass.

Figure 15A:
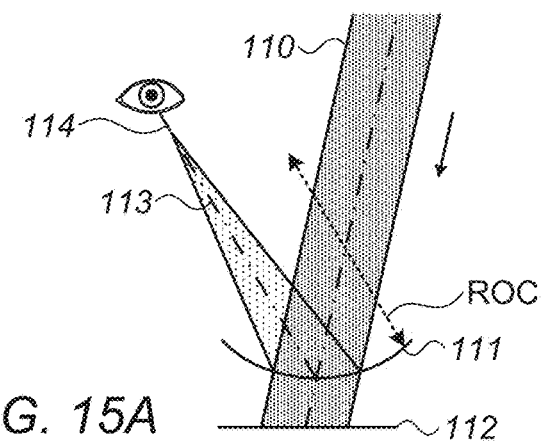
FIGS. 15A, 15B, and 15C show schematic drawings of exemplary apparatus according to the present disclosure, for avoiding unsafe reflections from the front surface of a receiver being illuminated by a transmitter of the present disclosure.
Figure 15B:
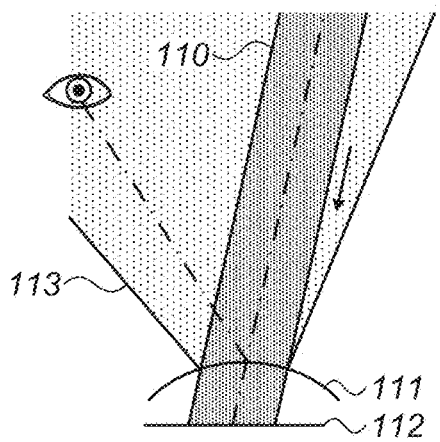
Figure 15C:
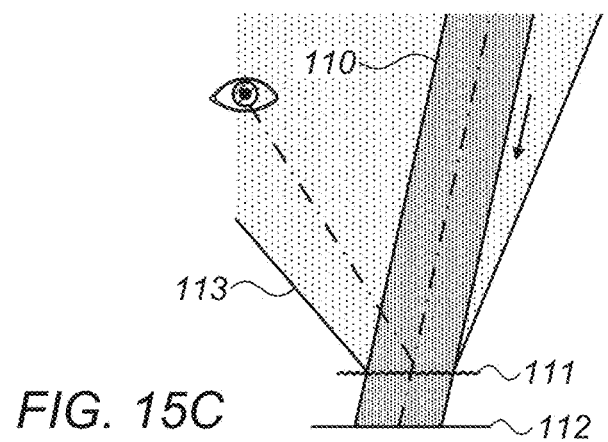

Reference is now made to FIGS. 15A to 15C, which illustrate schematically methods of avoiding the above-mentioned unsafe reflections, even for the small part of the incident light which may be reflected from the surface. FIG. 15A shows a situation where the surface is a concave surface, FIG. 15B shows a situation where the surface is a convex surface, and FIG. 15C shows the situation where the surface is a diffusive surface. In FIG. 15A, an incident beam 110, having at least 8 kW/m²/Steradian radiance, is directed towards photovoltaic cell 112, passing through a front surface 111, which may be the front surface of the photovoltaic cell. The front surface 111 reflects some of beam 110 creating a focused beam 113 with a focal point 114 some distance from the surface. In order to ensure that focal point 114 does not present any danger to an eye or skin, or other objects, the Radius of Curvature (ROC) of the surface 111 must be such that the beam is focused with low numerical aperture, as in FIG. 15A, or that it be defocused, as in FIG. 15B, or that it be diffused, as in FIG. 15C. To achieve these limitations, if the surface is concave looking from the transmitter towards the photovoltaic cell, as in FIG. 15A, its ROC must be larger than 1 cm, and if higher power systems are used, typically above 0.5 W of light, it should be greater than 5 cm. Alternatively, the surface ROC can be negative, as in FIG. 15B, but the ROC cannot be in the range 0-1 cm. These limitations will ensure that the reflected beam of light has a focal point which is either virtual, i.e. associated with a diverging reflected beam, or at least 1 cm in front of the surface, such that the risk generated by the focus is significantly reduced. The surface may also have numerous regions with smaller curvatures, creating a diffusive surface, as in FIG. 15C, which significantly helps reducing the risk of a dangerous focal point. In such a case, the radius of curvature of each sub section of the surface may be smaller than 1 cm without creating a focal point. Furthermore, if the surface is split into multiple zones, each zone may have smaller curvature.

In order to operate safely, the system also needs to be able to direct the power beam to the photovoltaic cell so that it is blocked by it, and not be directed at some unsafe region. In order to accomplish that, a detector should be positioned to provide indication of the impingement of the beam on the receiver. Such a detector should typically be positioned in the receiver, but configurations where such a detector is located in the transmitter are also possible, in which case the detector should be responsive to a phenomenon occurring due to the impact of the beam on the receiver. Such a transmitter-associated system may include image acquisition and processing of optical information received from the receiver, such as the reflection of the beam from a barcode printed on the receiver, so that the transmitter may detect the barcode's illumination pattern. Reflections from a retro reflector or retro reflectors or arrays or patterns thereof may be positioned on the receiver and such reflection may be detected in the transmitter, either by way of image processing, by measuring back reflection or by measuring coherence effects of the reflection. The detector may be a current or voltage sensor positioned in the receiver, a photodiode in the receiver or in the transmitter, or an imaging device which may be either in the transmitter or the receiver. A retroreflector in the vicinity of the photovoltaic cell may also be used, in combination with an additional detector in the transmitter, detecting light reflected from the retroreflector.

The detector, upon detecting the beam of light impinging on the photovoltaic cell, sends a signal accordingly to the system controller. If the detector is in the receiver, such signalling may be done wirelessly, using a communication channel which may be RF, IR, visible light, UV, modulation of the beam, TCP/IP, or sound. The system controller is usually located in the transmitter, but may also be located in a main control unit, which may even be on a computer network from the transmitter. On receipt of the signal, the controller responds by performing at least one of:

(a) Changing the state of the laser driver; or
(b) Changing the operational properties of the beam steering apparatus, such as the direction to which it directs the beam, or the speed in which such direction is changed.

Figure 16:
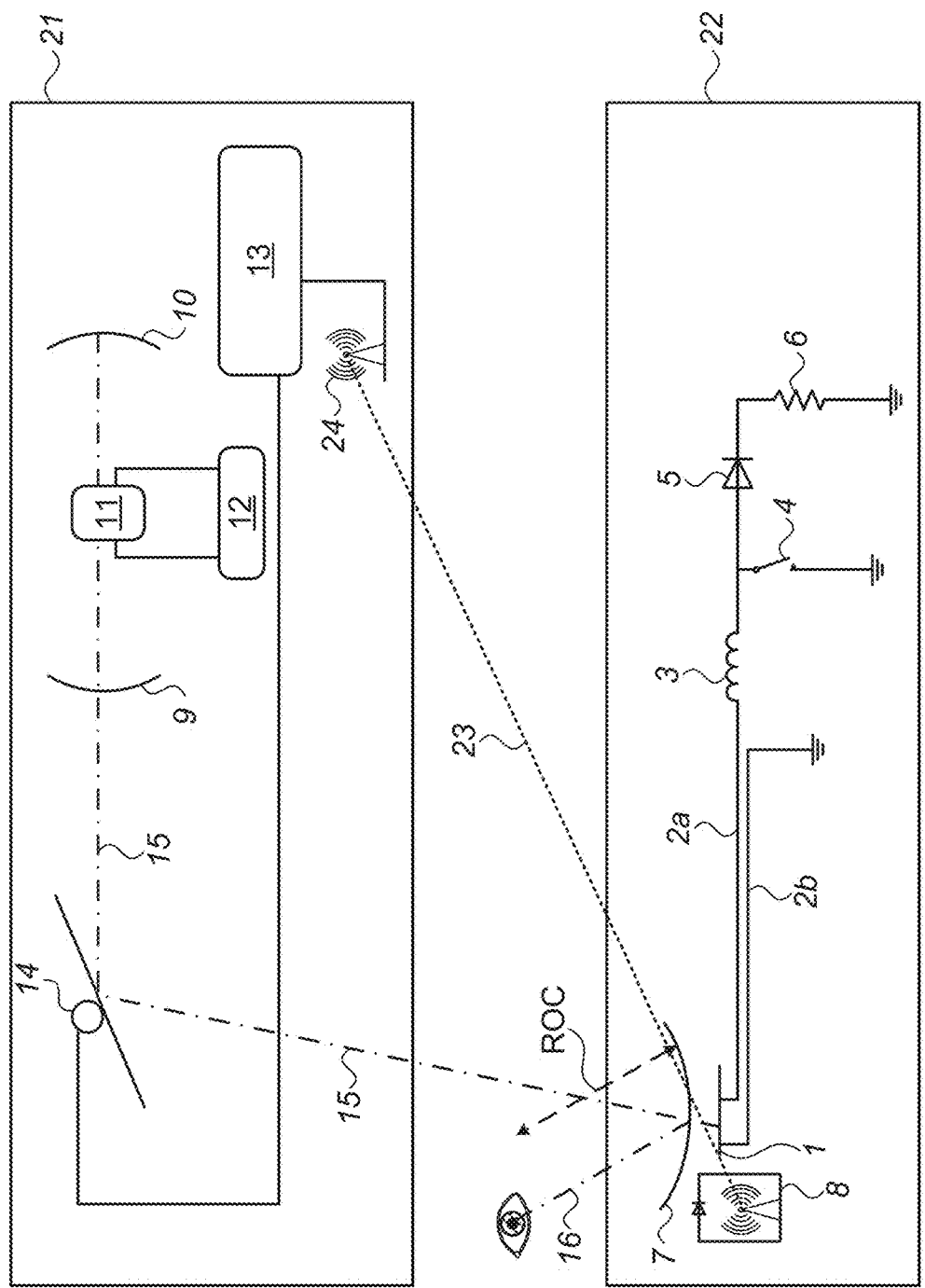
FIG. 16 shows a schematic diagram showing a more detailed description of the complete optical wireless power supply system of the present disclosure.

Reference is now made to FIG. 16, which is a schematic diagram showing a detailed description of the complete system. The system comprises transmitter 21 and receiver 22. In general, the transmitter and receiver will be located remotely from each other, but are shown in FIG. 16, for convenience, to be close to each other. Beam 15 transfers power from transmitter 21 to receiver 22.

On the receiver 22, the front surface 7 reflects a small part of incident beam 15 as a reflected beam 16, while either diffusing it or creating a virtual focal point behind front surface 7, or a real focal point at least 1 cm in front of surface 7. After transmission through the at least partially transparent surface 7, beam 15 impinges on the optical-to-electrical power converter 1.

The optical-to-electrical power converter 1 may be enclosed in a package that may have a front window, which may be surface 7 or a separate window. It may also be coated to have an external surface adapted to function as an interface with the air, or the adhesive or the glass surrounding it. In a typical configuration, the optical-to-electrical power converter 1 could be a junction of semiconductor layers, which typically have conductors deposited on them. In many embodiments surface 7 would be coated on, or be the external surface of one of these semiconductor layers.

Signalling detector 8 indicates that beam 15 is impinging on photovoltaic cell 1 and transmits that information to the controller 13, in this example system, located in the transmitter 21. The control signal is transmitted by a link 23 to a detector 24 on the transmitter.

Electrical power converter 1, has a bandgap E8 and typically yields a voltage between 0.35 and 1.1V, though the use of multi-junction photovoltaic cells may yield higher voltages. Power flows from the photovoltaic cell 1 through conductors 2a and 2b, which have low resistance, into inductor 3 which stores some of the energy flowing through it in a magnetic field.

Automatic switch 4, typically a MOSFET transistor connected to a control circuit (not shown in FIG. 16), switches between alternating states, allowing the current to flow through the inductor 3 to the ground for a first portion of the time, and for a second portion of the time, allowing the inductor to emit its stored magnetic energy as a current at a higher voltage than that of the photovoltaic cell, through diode 5 and into load 6, which can then use the power.

Automatic switch 4 may be operating at a fixed frequency or at variable frequency and/or duty cycle and/or wave shape which may either be controlled from the transmitter, or be controlled from the client load, or be based on the current, voltage, or temperature at the load, or be based on the current, voltage or temperature at automatic switch 4, or be based on the current, voltage or temperature emitted by the optical-to-electrical power converter 1, or be based on some other indicator as to the state of the system.

The receiver may be connected to the load 6 directly, as shown in FIG. 16, or the load 6 can be external to the receiver, or it may even be a separate device such as a cellphone or other power consuming device, and it may be connected using a socket such as USB/Micro USB/Lightning/USB type C.

In most cases there would also be an energy storage device, such as a capacitor or a battery connected in parallel to load 6, or load 6 may include an energy storage device such as a capacitor or a battery.

Transmitter 21 generates and directs beam 15 to the receiver 22. In a first mode of operation, transmitter 21 seeks the presence of receivers 22 either using a scanning beam, or by detecting the receiver using communication means, such as RF, Light, IR light, UV light, or sound, or by using a camera to detect a visual indicator of the receivers, such as a retro-reflector, or retro-reflective structure, bar-code, high contrast pattern or other visual indicator. When a coarse location is found, the beam 15, typically at low power, scans the approximate area around receiver 22. During such a scan, the beam 15 impinges on photovoltaic cell 1. When beam 15 impinges on photovoltaic cell 1, detector 8 detects it and signals controller 13 accordingly.

Controller 13 responds to such a signal by either or both of instructing laser driver 12 to change the power P it inputs into gain medium 11 and or instructing mirror 14 to alter either its scan speed or direction it directs the beam to or to hold its position, changing the scan step speed. When gain medium 11 receives a different power P from the laser power supply 12, its small signal gain—the gain a single photon experiences when it transverses the gain medium, and no other photons traverse the gain medium at the same time,—changes. When a photon, directed in a direction between back mirror 10 and output coupler 9 passes through gain medium 11, more photons are emitted in the same direction—that of beam 15—and generate optical resonance between back mirror 10 and output coupler 9.

Output coupler 9 is a partially transmitting mirror, having reflectance R, operating at least on part of the spectrum between the first overtone of the C—H absorption at 6940 $cm^{-1}$ and the second overtone of the C—H absorption at 8130 $cm^{-1}$, and is typically a multilayer dielectric or semiconductor coating, in which alternating layers of different refractive index materials are deposited on a substrate, which is typically glass, plastic or the surface of gain medium 11. Alternatively Fresnel reflection can be used if the gain medium is capable of providing sufficient small signal gain or has a high enough refractive index, or regular metallic mirrors can be used. A Bragg reflector may also be used, should the gain medium be either a semiconductor or a fiber amplifier. Output coupler 9 may also be composed of a high reflectance mirror combined with a beam extractor, such as a semi-transparent optical component that transmits a part of the light and extracts another part of the light from the forward traveling wave inside the resonator, but typically also a third portion extracted from the backwards propagating wave inside the resonator.

Back reflector 10 should be a high reflectance mirror, although a small amount of light may back-leak from it and may be used for monitoring or other purposes, working at least on part of the spectrum between the first overtone of the C—H absorption at 6940 cm$^{-1}$ and the second overtone of the C—H absorption at 8130 cm$^{-1}$. It may typically be constructed of alternating layers of different refractive index materials deposited on a substrate, usually glass, metal or plastic. Alternatively Fresnel reflection can be used if the gain medium is capable of providing sufficient small signal gain, or regular metallic mirrors can be used. A Bragg reflector may also be used should the gain medium be either a semiconductor or a fiber amplifier.

Gain medium 11 amplifies radiation between the first overtone of the C—H absorption at 6940 cm$^{-1}$ and the second overtone of the C—H absorption at 8130 cm$^{-1}$, although not necessarily over the whole of this spectral range. It is capable of delivering small signal gain larger than the loss caused by output coupler 9 when pumped with power P by laser driver 12. Its area, field of view, and damage thresholds should be large enough to maintain a beam of at least 8 kW/m$^2$/Steradian/(1−R), where R is the reflectance of output coupler 9. It may be constructed of either a semiconductor material having a bandgap between 0.8-1.1 eV or of a transparent host material doped with Nd ions, or of another structure capable of stimulated emission in that spectral range. Gain medium 11 is positioned in the optical line of sight from the back reflector 10 to output coupler 9, thus allowing radiation reflected by the back reflector 10 to resonate between the back reflector 10 and the output coupler 9 through gain medium 11.

For the exemplary implementation where the gain medium 11 is a semiconductor having a bandgap between 0.8-1.1 eV, it should be preferably attached to a heat extracting device, and may be pumped either electrically or optically by laser driver 12.

In the exemplary implementation where the gain medium 11 is a transparent host, such as YAG, YVO$_4$, GGG, or glass or ceramics, doped with Nd ions, then gain medium 11 should preferably also be in optical communication with a filter for extracting radiation around 9400 cm$^{-1}$ from that resonating between back mirror 10 and output coupler 9.

Figure 17:
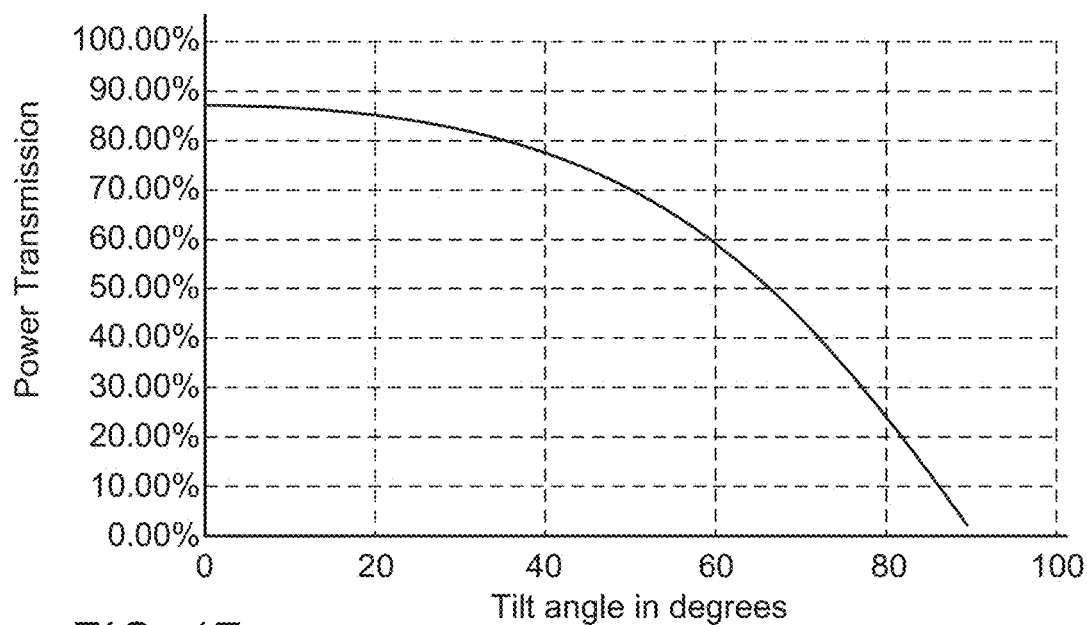
FIG. 17 is a graph showing the change in power transmission of the system of FIG. 16, as a function of the angle of tilt of the beam steering mirror.

The beam steering apparatus 14 is shown controlled by controller 13. It can deflect beam 15 into a plurality of directions. Its area should be large enough so that it would contain essentially most of beam 15 even when tilted to its maximal operational tilt angle. Taking a simplistic 2D example, if beam 15 were to be a collimated 5 mm diameter (1/e$^2$ diameter) Gaussian beam, and the beam steering apparatus were to be a single round gimballed mirror centered on the beam center, and if the maximal tilt required of the mirror is 30 degrees, and assuming that beam steering apparatus 14 has no other apertures, then if the mirror has a 5 mm diameter like that of the beam, it would have an approximately 13% loss at normal incidence to the beam, but approximately 60% loss at 60 degrees tilt angle. This would severely damage the system's performance. This power loss is illustrated in the graph of FIG. 17.

At the beginning of operation, controller 13 commands laser driver 12 and mirror 14 to perform a seek operation. This may be done by aiming beam 15, with the laser driver 12 operating in a first state, towards the general directions where a receiver 22 is likely to be found. For example, in the case of a transmitter mounted in a ceiling corner of a room, the scan would be performed downwards and between the two adjacent walls of the room. Should beam 15 hit a receiver 22 containing an optical-to-electric power converter 1, then detector 8 would signal as such to controller 13. So long as no such signal is received, controller 13 commands beam steering 14 to continue directing beam 15 in other directions, searching for a receiver. If such a signal is received from detector 8, then controller 13 may command beam steering 14 to stop or slow down its scan to lock onto the receiver, and to instruct laser driver 12 to increase its power emission. Alternatively controller 13 may note the position of receiver 22 and return to it at a later stage.

When laser driver 12 increases its power emission, the small signal gain of gain medium 11 increases, and as a result beam 15 carries more power and power transmission begins. Should detector 8 detect a power loss greater than a threshold, which may be pre-determined or dynamically set, and which is typically at a level representing a significant portion of the maximal permissible exposure level, and which is also typically greater than the system noise figure, these conditions implying either that beam 15 is no longer aimed correctly at the optical-to-electrical power converter 1, or that some object has entered the beam's path, or that a malfunction has happened, controller 13 should normally command laser driver 12 to change its state, by reducing power to maintain the required safety level. If another indication of safe operation is present, such as an indication from the user as to the safety of transmission, which may be indicated by a user interface or an API, or an indication of safe operation from a second safety system, the controller may command the laser to increase power to compensate for the power loss. The controller 13 may also command the beam steering assembly 14 to perform a seeking operation again.

There may be two different stages in the seek operation. Firstly, a coarse search can be performed using a camera, which may search for visual patterns, for a retro reflector, for high contrast images, for a response signal from receivers or for other indicators, or by using the scanning feature of beam steering 14. A list of potential positions where receivers may be found can thus be generated. The second stage is a fine seek, in which the beam steering mirror 14 directs beam 15 in a smaller area until detector 8 signals that beam 15 is impinging on an optical-to-electrical power converter 1.

Figure 18:
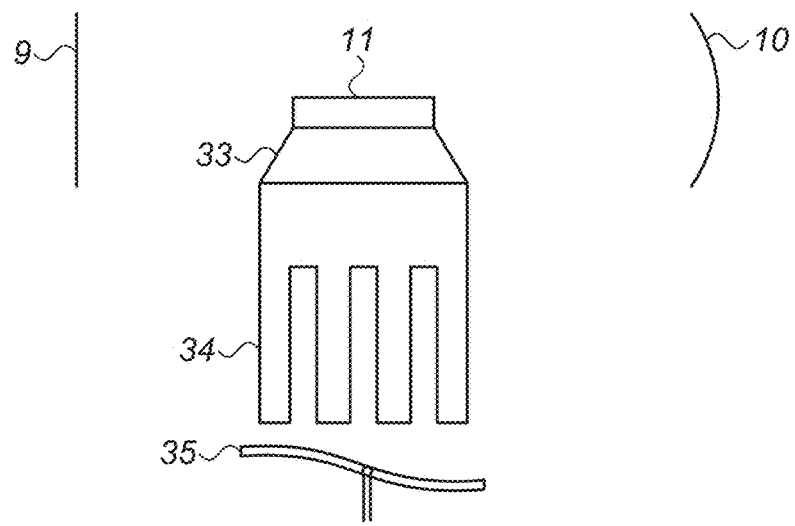
FIG. 18 shows a schematic representation of a cooling system for the gain medium of the system of FIG. 16.

Reference is now made to FIG. 18, shows an example cooling system for the gain medium 11 of the system of FIG. 16. Although the reflectors 9, 10 are shown as separate optical elements, it is to be understood that one or both of them may be coated directly on the gain medium end faces for simplifying the system. Gain medium 11 converts the power it receives from the laser driver 12 into both heat and photons, and would typically degrade the system performance if the gain medium were to be heated above a certain temperature.

For that reason, gain medium 11 is attached to heatsink 34 using a bonding agent 33 which is preferably a heat conducting solder having low thermal resistance. Bonding agent 33 may also be a conductive adhesive. Bonding agent 33 may have a thermal expansion coefficient which is between that of gain medium 11 and heat sink 34. Heat sink 34 may typically be a low thermal resistance heatsink made out of metal, which may be equipped with fins for increasing its surface area or an external fluid pumping system such as a fan or a liquid pump 35.

Figure 19:
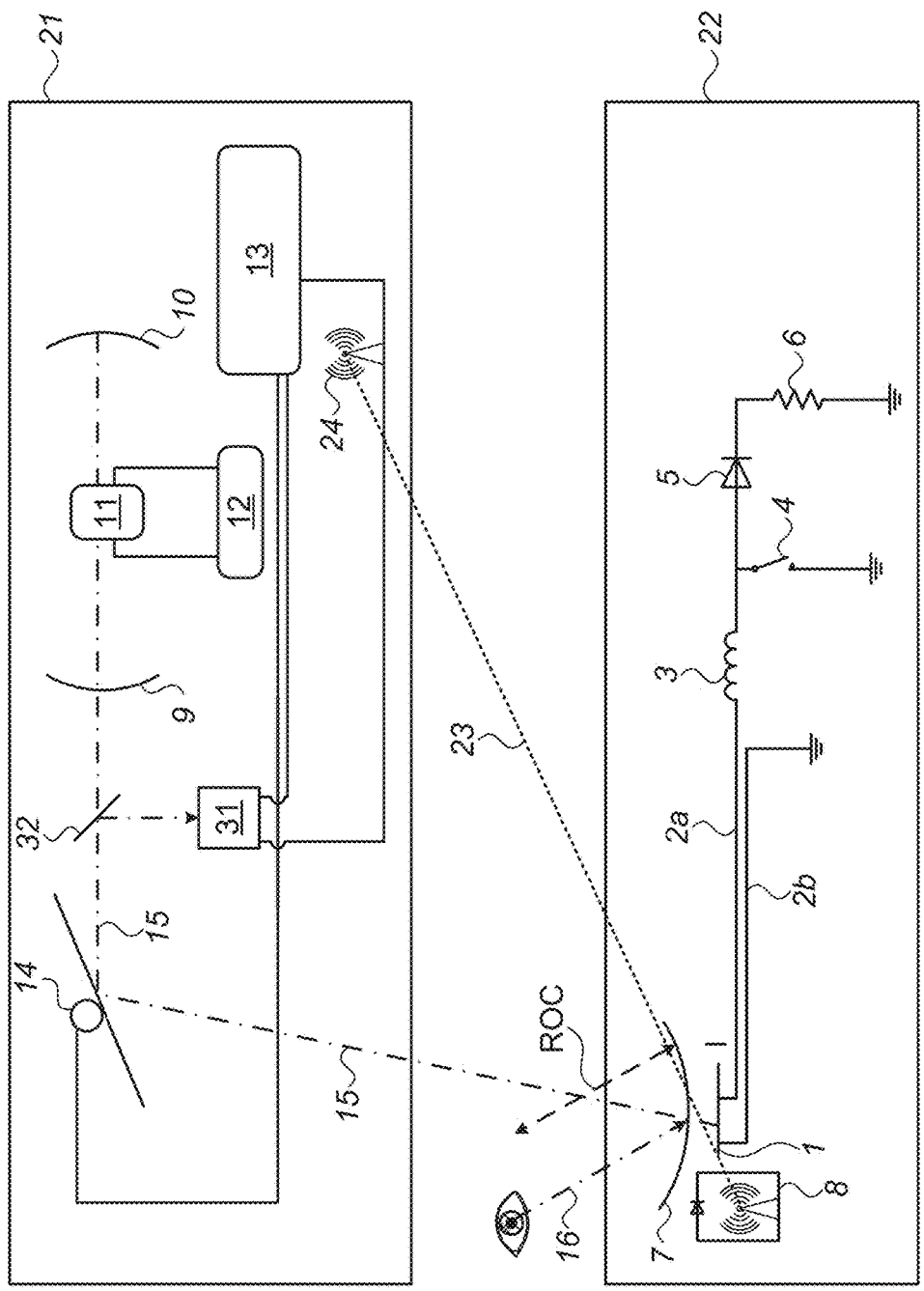
FIG. 19 is a schematic diagram showing a detailed description of the system of FIG. 16, but further incorporating a safety system.

Reference is now made to FIG. 19, which is a schematic diagram showing a detailed description of the system of FIG. 16, but further incorporating a safety system 31, constructed and operable according to the methods and systems described in the present application. Although shown in FIG. 19 as a separate module, in order to show the additional inputs provided thereto, the safety system can be incorporated into the controller 13, and is generally described and may be claimed thereas. As described above, the system comprises transmitter 21 and receiver 22. In general, the transmitter and receiver will be located remotely from each other, but are shown in FIG. 19, for convenience, to be close to each other. Beam 15 transfers power from transmitter 21 to receiver 22.

On the receiver 22, the front surface 7 reflects a small part of incident beam 15 as a reflected beam 16, while either diffusing it or creating a virtual focal point behind front surface 7, or a real focal point at least 1 cm in front of surface 7. After transmission through the at least partially transparent surface 7, beam 15 impinges on the optical-to-electrical power converter 1 having a semiconductor layer having thickness T and an absorption coefficient to said optical beam 15. The thickness of the layer is dependent on the designed wavelength of the beam, and, when measured in cm, should be greater than 0.02 times the reciprocal of the absorption coefficient of the optical beam in the semiconductor layer, as described in further details on FIG. 20 below.

The optical-to-electrical power converter 1 may be enclosed in a package that may have a front window, which may be surface 7 or a separate window. It may also be coated to have an external surface adapted to function as an interface with the air, or the adhesive or the glass surrounding it. In a typical configuration, the optical-to-electrical power converter 1 could be a junction of semiconductor layers, which typically have conductors deposited on them. In many embodiments surface 7 would be coated on, or be the external surface of one of these semiconductor layers.

Signaling detector 8 indicates that beam 15 is impinging on photovoltaic cell 1 and transmits that information to the controller 13, in many cases it also transmits other data such as the power received, the optical power received, identification information, temperatures of the receiver and photovoltaic as well as information relayed from the client device, which may be control information. In this example, system controller 13 is located in the transmitter 21, but may also be located remotely therefrom. The control signal is transmitted by a link 23 to a detector 24 on the transmitter.

Safety system 31 receives information from various sources, further detailed in FIG. 21 below, and especially may receive information from a small portion of the beam 15 coupled out by beam coupler 32, and from the signaling detector 8, usually through a data channel between the power receiver and the power transmitter. Safety system 31 outputs safety indications to control unit 13.

Electrical power converter 1, has a bandgap E8 and typically yields a voltage between 0.35 and 1.1V, though the use of multi-junction photovoltaic cells may yield higher voltages. Power flows from the photovoltaic cell 1 through conductors 2a and 2b, which have low resistance, into inductor 3, which stores some of the energy flowing through it in a magnetic field.

Automatic switch 4, typically a MOSFET transistor connected to a control circuit (not shown in FIG. 19), switches between alternating states, allowing the current to flow through the inductor 3 to the ground for a first portion of the time, and for a second portion of the time, allowing the inductor to release its stored magnetic energy as a current at a higher voltage than that of the photovoltaic cell, through diode 5 and into load 6, which can then use the power.

Automatic switch 4 may operate at a fixed frequency or at variable frequency and/or duty cycle and/or wave shape, which may be controlled either from the transmitter, or be controlled from the client load, or be based on the current, voltage, or temperature at the load, or be based on the current, voltage or temperature at automatic switch 4, or be based on the current, voltage or temperature emitted by the optical-to-electrical power converter 1, or be based on some other indicator as to the state of the system.

The receiver may be connected to the load 6 directly, as shown in FIG. 16, or the load 6 can be external to the receiver, or it may even be a separate device such as a cellphone or other power consuming device, and it may be connected using a socket such as USB/Micro USB/Lightning/USB type C. The receiver typically further comprises a load ballast used to dissipate excess energy from the receiver, which may not be needed by the client.

In most cases, there would also be an energy storage device, such as a capacitor or a battery connected in parallel to load 6, or load 6 may include an energy storage device such as a capacitor or a battery.

Transmitter 21 generates and directs beam 15 to the receiver 22. In a first mode of operation, transmitter 21 seeks the presence of receivers 22 either using a scanning beam, or by detecting the receiver using communication means, such as RF, Light, IR light, UV light, or sound, or by using a camera to detect a visual indicator of the receivers, such as a retro-reflector, or retro-reflective structure, bar-code, high contrast pattern or other visual indicator. When a coarse location is found, the beam 15, typically at low power, scans the approximate area around receiver 22. During such a scan, the beam 15 should impinge on photovoltaic cell 1. When beam 15 impinges on photovoltaic cell 1, detector 8 detects it and signals controller 13 accordingly.

Controller 13 responds to such a signal by either or both of instructing laser driver 12 to change the power P input into gain medium 11 and or instructing mirror 14 to alter either its scan speed or direction it directs the beam to or to hold its position, changing the scan step speed. When gain medium 11 receives a different power P from the laser power supply 12, its small signal gain—the gain a single photon experiences when it transverses the gain medium, and no other photons traverse the gain medium at the same time—changes. When a photon, directed in a direction between back mirror 10 and output coupler 9 passes through gain medium 11, more photons are emitted in the same direction—that of beam 15—and generate optical resonance between back mirror 10 and output coupler 9.

Output coupler 9 is a partially transmitting mirror, having reflectance R, operating at least on part of the spectrum between the first overtone of the C—H absorption at 6940 $cm^{-1}$ and the second overtone of the C—H absorption at 8130 $cm^{-1}$, and is typically a multilayer dielectric or semiconductor coating, in which alternating layers of different refractive index materials are deposited on a substrate, which is typically glass, plastic or the surface of gain medium 11. Alternatively, Fresnel reflection can be used if the gain medium is capable of providing sufficient small signal gain or has a high enough refractive index, or regular metallic mirrors can be used. A Bragg reflector may also be used, should the gain medium be either a semiconductor or a fibre amplifier. Output coupler 9 may also be composed of a high reflectance mirror combined with a beam extractor, such as a semi-transparent optical component that transmits a part of the light and extracts another part of the light from the forward traveling wave inside the resonator, but typically also a third portion extracted from the backwards propagating wave inside the resonator.

Back reflector 10 should be a high reflectance mirror, although a small amount of light may be allowed to back-leak from it and may be used for monitoring or other purposes. These optical characteristics should operate at least on part of the spectrum between the first overtone of the C—H absorption at 6940 $cm^{-1}$ and the second overtone of the C—H absorption at 8130 cm$^{-1}$. It may typically be constructed of alternating layers of different refractive index materials deposited on a substrate, usually glass, metal or plastic. Alternatively, Fresnel reflection can be used if the gain medium is capable of providing sufficient small signal gain, or regular metallic mirrors can be used. A Bragg reflector may also be used should the gain medium be either a semiconductor or a fiber amplifier.

Gain medium 11 amplifies radiation between the first overtone of the C—H absorption at 6940 cm$^{-1}$ and the second overtone of the C—H absorption at 8130 cm$^{-1}$, although not necessarily over the whole of this spectral range. It is capable of delivering small signal gain larger than the loss caused by output coupler 9 when pumped with power P by laser driver 12. Its area, field of view, and damage thresholds should be large enough to maintain a beam of at least 8 kW/m$^2$/Steradian/(1−R), where R is the reflectance of output coupler 9. It may be constructed of either a semiconductor material having a bandgap between 0.8-1.1 eV or of a transparent host material doped with Nd ions, or of another structure capable of stimulated emission in that spectral range. Gain medium 11 is positioned in the optical line of sight from the back reflector 10 to output coupler 9, thus allowing radiation reflected by the back reflector 10 to resonate between the back reflector 10 and the output coupler 9 through gain medium 11.

For the exemplary implementation where the gain medium 11 is a semiconductor having a bandgap between 0.8-1.1 eV, it should preferably be attached to a heat extracting device, and may be pumped either electrically or optically by laser driver 12.

In the exemplary implementation where the gain medium 11 is a transparent host, such as YAG, YVO4, GGG, or glass or ceramics, doped with Nd ions, then gain medium 11 should preferably also be in optical communication with a filter for extracting radiation around 9400 cm$^{-1}$ from the radiation resonating between back mirror 10 and output coupler 9.

The beam steering apparatus 14 is shown controlled by controller 13. It can deflect beam 15 into a plurality of directions. Its area should be large enough so that it would contain essentially most of beam 15 even when tilted to its maximal operational tilt angle. Taking a simplistic 2D example, if beam 15 were to be a collimated 5 mm diameter (1/e$^2$ diameter) Gaussian beam, and the beam steering apparatus were to be a single round gimballed mirror centered on the beam center, and if the maximal tilt required of the mirror is 30 degrees, and assuming that beam steering apparatus 14 has no other apertures, then if the mirror has a 5 mm diameter similar to that of the beam, it would have an approximately 13% loss at normal incidence to the beam, but approximately 60% loss at 60 degrees tilt angle. This would severely damage the system's performance. This power loss is illustrated in the graph of FIG. 17, and in FIGS. 22 and 23.

At the beginning of operation, controller 13 commands laser driver 12 and mirror 14 to perform a seek operation. This may be done by aiming beam 15, with the laser driver 12 operating in a first state, towards the general directions where a receiver 22 is likely to be found. For example, in the case of a transmitter mounted in a ceiling corner of a room, the scan would be performed downwards and between the two adjacent walls of the room. Should beam 15 hit a receiver 22 containing an optical-to-electric power converter 1, then detector 8 would signal as such to controller 13. So long as no such signal is received, controller 13 commands beam steering 14 to continue directing beam 15 in other directions, searching for a receiver. If such a signal is received from detector 8, then controller 13 may command beam steering 14 to stop or slow down its scan to lock onto the receiver. Controller 13 then waits for safety system 31 to generate a signal indicating that it is safe to operate, and once such a safety signal is received from safety system 31, controller 13 may instruct laser driver 12 to increase its power emission. Alternatively, controller 13 may note the position of receiver 22 and return to it at a later stage, which may be done even without the presence of a safety signal.

When laser driver 12 increases its power emission, the small signal gain of gain medium 11 increases, and as a result, beam 15 carries more power and power transmission begins. Should detector 8 detect a power loss greater than a certain threshold, safety system 31, may report such a situation to controller 13, which should normally command laser driver 12 to change its state, by reducing power to maintain the required safety level. Such a power loss threshold may be pre-determined or dynamically set, and is typically at a level representing a significant portion of the maximal permissible exposure level, and is also typically greater than the system noise figure. Such conditions imply either that beam 15 is no longer aimed correctly at the optical-to-electrical power converter 1, or that some object has entered the beam's path, or that a malfunction has happened. If another indication of safe operation is present, such as an indication from the user as to the safety of transmission, which may be indicated by a user interface or an API, or an indication of safe operation from a second safety system, the controller may command the laser to increase power to compensate for the power loss. The controller 13 may also command the beam steering assembly 14 to perform a seek operation again.

There may be two different stages in the seek operation. Firstly, a coarse search can be performed using a camera, which may search for visual patterns, for a retro reflector, for high contrast images, for a response signal from receivers (such as a blinking light from a LED or other light source), or for other indicators, or the coarse search may be performed by using the scanning feature of beam steering unit 14. A list of potential positions where receivers may be found can thus be generated. The second stage is a fine seek, in which the beam steering mirror 14 directs beam 15 in a smaller area until detector 8 signals that beam 15 is impinging on an optical-to-electrical power converter 1.

Reference is now made to FIG. 20, which is a schematic view of the optical to electrical power converter, marked as item 1 in FIGS. 16, 19. Beam 15 impinges on photovoltaic cell 106, which is thermally connected to heat removal system 107. Beam 15 is absorbed by absorbing layer 108 causing a current to flow in conductors 111, the current being normally collected by a bus. The optical power absorbed by absorbing layer 108 is typically converted into electrical power and into heat. The electrical power is transferred through conductors 111 and a bottom electrode, while the thermal energy is evacuated mostly through a cooling system 107. Conductors 111 cast a shadow on absorbing layer 108 decreasing its efficiency, and it should therefore be made of a high conductivity material, such as materials having less than 3 E-6 Ohm*Meter specific electrical resistance. It can be shown that such conductors should have a thickness in meters that is at least $$\frac{0.034 * P \rho}{V^2 * \chi} m,$$

Where:
P is the power absorbed by the photovoltaic, measured in watts;
ρ is the specific electrical resistance of the conductors;
V is the voltage emitted by the photovoltaic cell at its maximal power point; and
χ is the fraction of the area of the absorbing layer covered by conductors.

The absorbing layer also needs to be thick enough to absorb most of beam 15 impinging on it. In order to do so, the thickness of absorbing layer 108 measured in meters, needs to be at least $0.02/\mu_{10}$, where $\mu_{10}$ is the decadic attenuation coefficient measured in 1/m.

Reference is now made to FIG. 21, which shows a block diagram view of the safety system 31 of FIG. 19. Safety system 31 receives inputs from various sensors and sub-systems and sends output to controller 13, in those situations where the safety system is not an integral part of the controller 13, or when parts of the safety system are in an external control unit. Safety system 13 can also sometimes receive inputs from those various sensors and sub-systems. Such inputs can be from wavelength sensor 407, which monitors primarily the beams wavelength, in order to provide information needed for estimating the safety limits associated with the beam. It may also receive information from a beam analyzer (401) which may monitor the beam's properties such as shape, $M^2$, symmetry, polarization, power, divergence, coherence and other information related to the beam and to the above parameters. It usually also receives information measured by external sub-systems through RF link 402. Temperature measurement of various components in the transmitter, receiver and surrounding area can be provided by temperature sensor(s) 403. It may receive an image from camera 404, which may be visible, thermal, IR or UV, and from power meter 406 measuring the beam's power at various positions. In many cases, the primary sensors connected to safety system 31 may be intrusion sensors (405) which monitor the beam for foreign objects traversing or approaching the beam path or its surroundings. It may also receive inputs from other sensors such as current, voltage, smoke, humidity and other environmental sensors. Upon reception of those inputs, or at a prescheduled time, safety system 31 assesses the potential for a security breach and issues a notification to controller 13 if that assessment exceeds a predetermined threshold.

Figure 22:
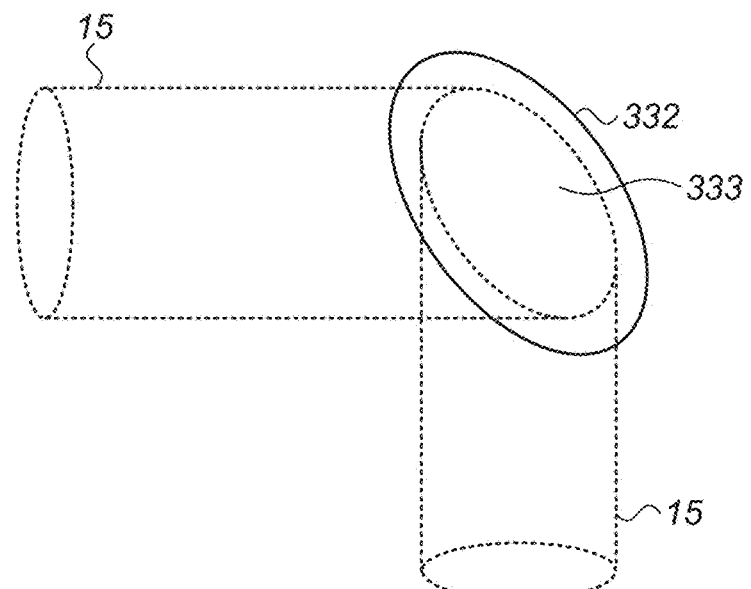
FIG. 22 shows an output laser beam of the system of FIG. 19, deflected by a mirror rotating on a gimbaled axis, or on gimbaled axes.
Figure 23:
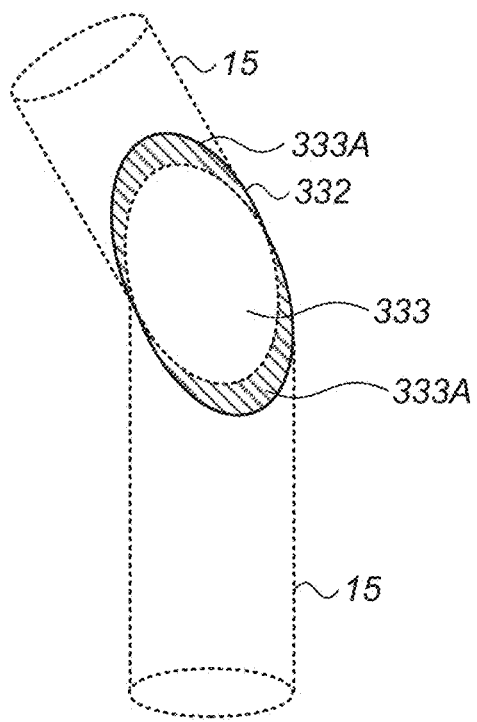
FIG. 23 shows the mirror of FIG. 22 rotated so that the beam is deflected at a larger angle than that shown in FIG. 22.

Reference is now made to FIG. 22 showing a beam deflected by a mirror rotating on a gimbaled axis, or on gimbaled axes. Beam 15 impinges on mirror 332 rotating around 2 axes in two dimensions. Beam 15 forms a spot 333 on mirror 332 and is deflected in a different direction. The importance of selecting the proper center of rotation and mirror dimensions becomes clearer by referring to FIG. 23. In FIG. 23, the mirror 332 has now rotated so that beam 15 is now deflected at a larger angle compared to FIG. 22. Due to the increased angle, spot 333 now forms a projection on the mirror surface longer than the effective length of mirror 332, so that a significant portion of beam 15, that portion being marked 333A, is now spilled around mirror 332. This spilling reduces the brightness of beam 15, both by reducing its power and by cutting off its edges, which in most cases, degrades the beam quality in the far field. Typically the beam diameter is reduced in the near field close to the mirror, or on images of the near field, and increased in the far field. In order to achieve a minimally dimensioned system, working at relatively high efficiency, it is important to maintain the brightness as high as possible. This can be done by reducing the brightness loss experienced by beam 15, across all angles within the field of view of the system. This may be done by mounting the mirror so that its center of rotation is essentially close to the beam's center, measured either by a weighted average of the beam's intensity, or by a cross section of the beam's diameter at a certain intensity, or by the center of an elliptic aperture through which the beam passes. It is noted that, in contrast to the length projection, the width of the beam projection on the mirror is unchanged with impingement angle.

Figure 24:
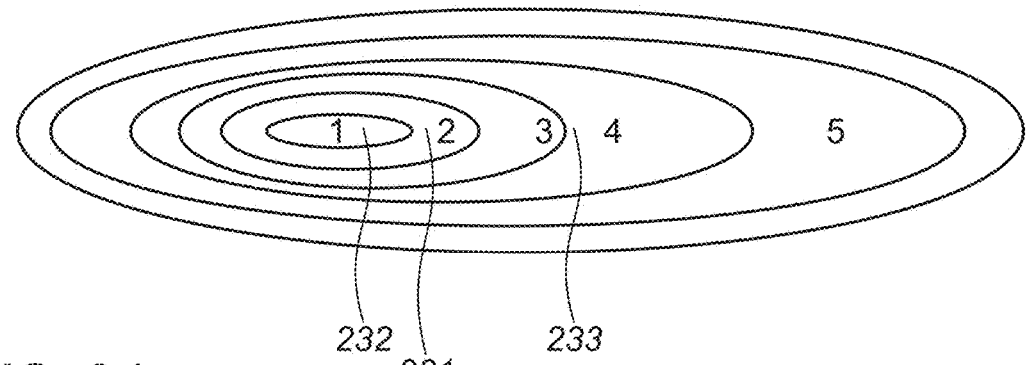
FIG. 24 shows a schematic representation of the intensity profiles of a typical deflected beam.

FIG. 24 shows a schematic representation of an intensity profile of a typical beam, contour 1 marks the 90% line of the maximum intensity, contour 2 marks the 80% of the maximum intensity line, contour 3 the FWHM (Full Width at Half Maximum) intensity line, contour 4 the 1/e intensity line, contour 5 the $1/e^2$ intensity line, and contour 6 the $1/e^4$ intensity line. Point 231 is approximately at the weighted average point of the beam, point 232 is at the center of the first contour and point 233 is at the center of the $6^{th}$ contour, all being valid points at which to place the center of rotation of the mirror. However, placing the center of rotation beyond such points will require a larger mirror in order to maintain high radiance efficiency of the gimballed mirror.

Maintaining high radiance efficiency for other components is also of importance, although the gimballed mirror and the first lens following the laser are typically the limiting components for the radiance efficiency.

Figure 25:
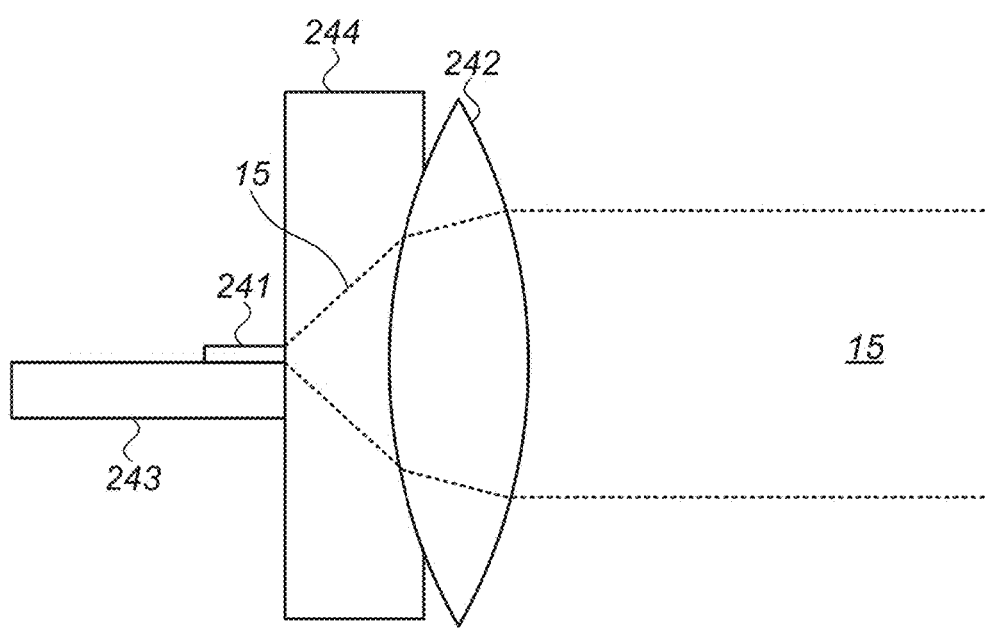
FIG. 25 shows a side view of a laser diode from a direction perpendicular to the fast axis of the laser, and a lens for manipulating the beam.

FIG. 25 shows a schematic side view of a laser diode from a direction perpendicular to the fast axis of the laser, also showing a lens 242 for manipulating, and usually nearly collimating the fast axis. In most cases lens, 242 is a compound lens, comprising several optical elements. Laser 241 is connected to heat sink 243 and emits beam 15, into interface layer 244, which has a refractive index n for the wavelength associated with beam 15. The value of n is 1.000293 in the case of an air interface at 532 nm, and higher in the case of oil or optical cement. Beam 15 has a divergence in at least one direction. The FWHM contour of beam 15 at the front surface of lens 242 has a diameter d, defined as the maximal distance between any two points on the FWHM contour. In order to have high radiance efficiency, lens 242 should have a numerical aperture NA with respect to the emitter of laser 241, of at least:

$$NA > \frac{0.36 * d}{BFL\sqrt{1 + \left(\frac{d}{2 * BFL * n}\right)^2}}$$

Where:
d is the FWHM diameter measured in mm between the two furthest points on the beam's FWHM contour on the lens front surface;
BFL is the back focal length of the lens measured in mm; and
n is the refractive index of the interface layer between the laser and the lens.

If a lens having a smaller Numerical Aperture is used, the radiance of the beam is reduced by the lens resulting in either poor efficiency of the system, or in larger receiver, which may be disadvantageous in many situations. Using a smaller NA will also result in heating of the lens holder, which may cause two harmful effects—firstly it may thermally expand and move the lens from its optimal position and secondly, it may apply force to the lens and cause it to distort thus reducing its optical quality and as a result reduce the radiance of the beam. Furthermore, a small NA may result in reflections towards the laser, which might interfere with the laser mode and further reduce the original beam's radiance, which may further harm the radiance of the emitted beam. The light emitted from the edges of the lens, if a small NA lens is used, may interfere with the operation of other parts of the system, such as beam monitors, a tracking servo or other optical elements in the system, or may cause excessive heating to other portions of the system, which may interfere with their operation.

Figure 26:
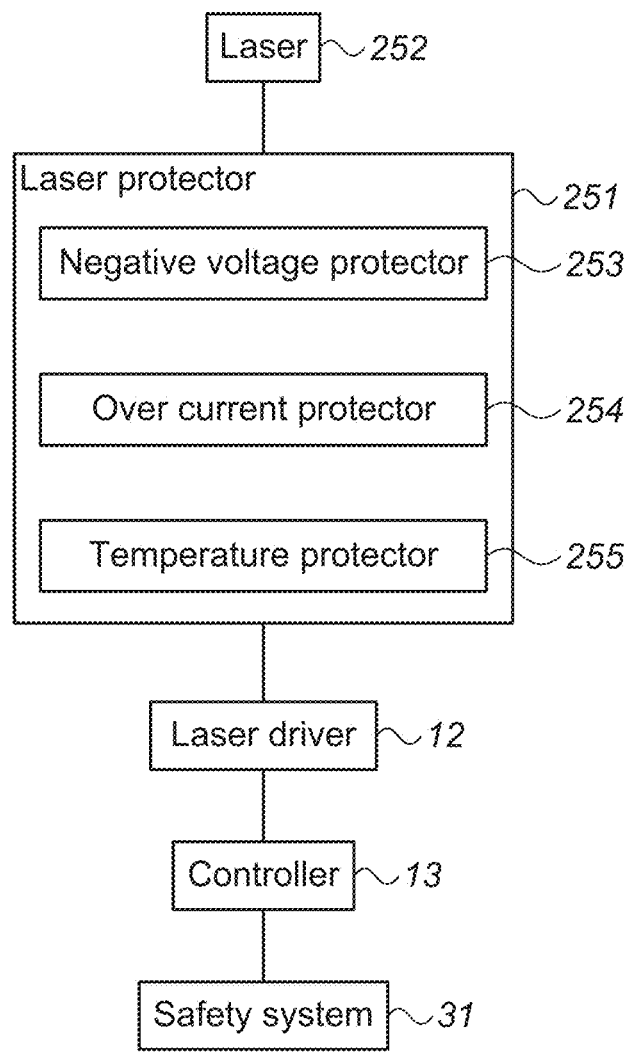
FIG. 26 shows a block diagram of the complete laser protector

Reference is now made to FIG. 26 showing a block diagram of the laser protector 251. As mentioned above, safety system 31 assesses the potential for a safety breach and notifies controller 13 in case such potential exceeds a threshold. Controller 13 may then command laser driver 12 to terminate or reduce the power supplied to laser 252, which may be the laser which is emitting beam 15, or it may be the laser pumping the gain medium which is used to generate beam 15. Such termination of power may need to be very fast. If the power supplied is cut or reduced suddenly, negative voltages may develop in the conductors carrying the laser driver current (if those are electrical conductors), which may damage laser 252. To prevent such damage to the laser 252, laser protector 251 is connected between laser driver 12 and the laser 252, typically close to the laser 252. Laser protector 251 protects the laser 252 from negative voltages, typically by connecting a diode, or an equivalent circuit/component such as a Zener diode, a varistor or a circuit designed to drain such excessive negative voltage quickly, between the current conductors, such that when a negative voltage exists between the conductors, current flows through the protective diode or equivalent circuit, causing a fast decay of the voltage to safe levels. Laser protector 251 can also be used to protect the laser from overheating, or from current waves, by attenuating the power sent to laser 252 when over-temperature or overcurrent is sensed.

It is appreciated by persons skilled in the art that the present invention is not limited by what has been particularly shown and described hereinabove. Rather the scope of the present invention includes both combinations and sub-combinations of various features described hereinabove as well as variations and modifications thereto which would occur to a person of skill in the art upon reading the above description and which are not in the prior art.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A system for optical wireless power transmission to at least one power receiving apparatus, said system comprising:
    an optical resonator having end reflectors and adapted to emit an optical beam;
    a gain medium comprising either (i) a semiconductor device, or (ii) a solid host doped with neodymium ions and in optical communication with a filter attenuating radiation for at least one frequency having a wave number in the range 8,300 cm−1 to 12,500 cm−1, said gain medium being positioned inside said optical resonator and having a first bandgap energy, said gain medium being thermally attached to a cooling system and configured to amplify light passing through it;
    a driver configured to supply power to said gain medium, and enabling control of the small signal gain of said gain medium;
    a beam steering apparatus configured to direct said optical beam in at least one of a plurality of directions;
    an optical-to-electrical power converter located in said at least one power receiving apparatus and configured to convert said optical beam into electrical power having a voltage, said optical-to-electrical power converter having a second bandgap energy;
    a detector configured to provide a signal indicative of said optical beam impinging on said optical-to-electrical power converter;
    a voltage converter connected to the output of said optical-to-electrical power converter, said voltage converter comprising an inductor having an inductance between $$L = \frac{1}{1.28*10^{-40}*f} * E_{gain}^2 * \frac{1 - \frac{E_{gain}}{5*10^{-19}*V_{output}}}{P_{laser\_driver}}$$

and $$L = \frac{1}{3*10^{-38}*f} * E_{gain}^2 * \frac{\left(1 - \frac{E_{gain}}{4*10^{-20}*V_{output}}\right)}{P_{laser\_driver}}$$

where f in the switching frequency measured in Hertz, $E_{gain}$ is the bandgap energy of the gain medium measured in Joules, $V_{output}$ is the output voltage of the DC/DC converter in volts and $P_{laserdriver}$ is the power measured in watts, supplied to the gain medium by the laser driver;
    and
    a controller adapted to control at least one of the status of said beam steering apparatus and said driver, said controller receiving a control input signal at least from said detector,
    wherein said optical beam has a radiance of at least 8kW/m2/Steradian and the overall radiance efficiency of the transmission between said transmitter and said at least one power receiving apparatus is at least 20%.

2. A system according to claim 1 wherein said voltage converter is configured to track the maximum power point of said optical-to-electrical power converter.

3. A system according to claim 1 wherein said voltage converter is a DC/DC boost voltage converter.

4. A system according to claim 1, wherein said resonator comprises at least one dielectric mirror.

5. A system according to claim 1, wherein said optical-to-electrical power converter is a photovoltaic cell.

6. A system according to claim 5 wherein said photovoltaic cell comprises a III-V semiconductor material.

7. A system according to claim 1, further including an inductor and an energy storage device that may be a capacitor or a rechargeable battery.

8. A system according to claim 1, wherein said system is configured to receive information from said power receiving apparatus.

9. A system according to claim 8 wherein said information includes at least one of battery status, device identification, power needs, voltage needs and a key.

10. A system according to claim 1, further comprising a sensor for determining the temperature of said optical-to-electrical power converter.

11. A system according to claim 10 configured to modify the power of said optical beam in response to changes in said temperature of said optical-to-electrical power converter.

12. A system according to claim 1, further comprising an optical window positioned between said photovoltaic optical-to-electrical power converter and said beam steering apparatus, said window having a refractive index of at least 1.5.

13. A system according to claim 1, wherein said second bandgap energy is smaller than said first bandgap energy.

14. A system according to claim 1, wherein said controller is adapted such that said beam steering apparatus directs said optical beam onto said at least one power receiving apparatus.

15. A system for optical wireless power transmission to at least one power receiving apparatus, said system comprising:
- an optical resonator having end reflectors and adapted to emit an optical beam;
- a gain medium comprising either a semiconductor device or a solid host doped with Neodymium ions and in optical communication with a filter attenuating radiation for at least one frequency having a wave number in the range 8,300 cm−1 to 12,500 cm—1, said gain medium being positioned inside said optical resonator and having a first bandgap energy, said gain medium being thermally attached to a cooling system and configured to amplify light passing through it;
- a driver configured to supply power to said gain medium, and enabling control of the small signal gain of said gain medium;
- a beam steering apparatus configured to direct said optical beam in at least one of a plurality of directions;
- an optical-to-electrical power converter located in said at least one power receiving apparatus, and configured to convert said optical beam into electrical power having a voltage, said optical-to-electrical power converter having a second bandgap energy;
- a detector configured to provide a signal indicative of said optical beam impinging on said optical-to-electrical power converter;
- a voltage converter connected to the output of said optical-to-electrical power converter, said voltage converter comprising an inductor having an inductance between $$L = \frac{1}{1.28 * 10^{-40} * f} * E_{gain}^2 * \frac{1 - \frac{E_{gain}}{5 * 10^{-19} * V_{output}}}{P_{laser\_driver}}$$

and $$L = \frac{1}{3 * 10^{-38} * f} * E_{gain}^2 * \frac{\left(1 - \frac{E_{gain}}{4 * 10^{-20} * V_{output}}\right)}{P_{laser\_driver}}$$

where f in the switching frequency measured in Hertz, $E_{gain}$ is the bandgap energy of the gain medium measured in Joules, $V_{output}$ is the output voltage of the DC/DC converter in volts and $P_{laserdriver}$ is the power measured in watts, supplied to the gain medium by the laser driver;

and a controller adapted to control at least one of the status of said beam steering apparatus and said driver, said controller receiving a control input signal at least from said detector, wherein said controller is configured to respond to an indication of a safety risk occurring in the system, by outputting a command to result in at least one of:
- causing said driver to change the small signal gain of the gain medium;
- changing the radiance of said optical beam;
- changing the power supplied by said driver;
- changing the scan speed of said beam steering apparatus;
- changing the pose of said beam steering apparatus; and
- recording the scan pose which defines the location of said optical-to-electrical power converter.

16. A system according to claim 15 wherein said indication of a safety risk occurring in the system is obtained at least from said signal generated by said detector configured to provide a signal indicative of said optical beam impinging on said optical-to-electrical power converter, and from a signal generated by the level received at said resonator of said beam reflected from said at least one power receiving apparatus.

17. A system according to claim 15 wherein said voltage converter is configured to track the maximum power point of said optical-to-electrical power converter.

18. A system according to claim 15 wherein said voltage converter is a DC/DC boost voltage converter.

19. A system according to claim 15 wherein said optical-to-electrical power converter is a photovoltaic cell.

20. A system according to claim 19 wherein said photovoltaic cell comprises a III-V semiconductor material.

21. A system according to claim 15, further including an energy storage device that may be a capacitor or a rechargeable battery.

22. A system according to claim 15, wherein said system is configured to receive information from said at least one power receiving apparatus said information including at least one of battery status, device identification, power needs, voltage needs and a key.

23. A system according to claim 15, further comprising a sensor for determining the temperature of said optical-to-electrical power converter.

24. A system according to claim 23, said system configured to modify the power of said optical beam in response to changes in said temperature of said optical-to-electrical power converter.

25. A system according to claim 15, further comprising an optical window positioned between said photovoltaic optical-to-electrical power converter and said beam steering apparatus, said window having a refractive index of at least 1.5.

26. A system according to claim 15, wherein said second bandgap energy is smaller than said first bandgap energy.

* * * * *